(12) United States Patent
Hamer et al.

(10) Patent No.: US 9,142,777 B2
(45) Date of Patent: Sep. 22, 2015

(54) APPARATUS AND METHOD FOR MAKING OLED LIGHTING DEVICE

(71) Applicant: OLEDWORKS LLC, Rochester, NY (US)

(72) Inventors: John W. Hamer, Rochester, NY (US); Michael L. Boroson, Rochester, NY (US)

(73) Assignee: OLEDWORKS LLC, Rochester, NY (US)

( * ) Notice: Subject to any disclaimer, the term of this patent is extended or adjusted under 35 U.S.C. 154(b) by 0 days.

(21) Appl. No.: 13/848,510

(22) Filed: Mar. 21, 2013

(65) Prior Publication Data

US 2014/0191201 A1    Jul. 10, 2014

Related U.S. Application Data

(63) Continuation-in-part of application No. 13/736,870, filed on Jan. 8, 2013.

(51) Int. Cl.
| | |
|---|---|
| *H01L 51/56* | (2006.01) |
| *H01L 51/00* | (2006.01) |
| *C23C 14/04* | (2006.01) |
| *C23C 14/12* | (2006.01) |
| *C23C 14/22* | (2006.01) |

(52) U.S. Cl.
CPC .......... *H01L 51/0011* (2013.01); *C23C 14/042* (2013.01); *C23C 14/12* (2013.01); *C23C 14/225* (2013.01); *H01L 51/56* (2013.01)

(58) Field of Classification Search
CPC .............................. H01L 51/0011; H01L 51/56
USPC .......... 257/40, 86, 94; 438/160, 162
See application file for complete search history.

(56) References Cited

U.S. PATENT DOCUMENTS

| | | | |
|---|---|---|---|
| 5,641,611 A | 6/1997 | Shieh et al. | |
| 5,953,587 A | 9/1999 | Forrest et al. | |
| 6,013,538 A | 1/2000 | Burrows et al. | |
| 6,091,196 A * | 7/2000 | Codama | 313/504 |

(Continued)

OTHER PUBLICATIONS

International Search Report issued in PCT/US2014/010591 mailed May 5, 2014.

(Continued)

*Primary Examiner* — Sheng Zhu
(74) *Attorney, Agent, or Firm* — Rossi, Kimms & McDowell LLP

(57) ABSTRACT

An apparatus for depositing one or more organic material layers of an OLED lighting device upon a first region of a substrate and one or more conducting layers upon a second region, wherein the conducting layers partially or completely cover and extend beyond one side of the organic layers, comprising: a reusable mask in contact with the substrate, at least one mask open area having an overhang feature; one or more sources of vaporized organic material, selected to form layers of the OLED lighting device, and the vaporized organic material plume is shaped, on the side corresponding to the mask overhang feature, so as to limit substantial transfer of organic material on said side to angles less than or equal to a selected cutoff angle to the first region; and one or more sources of vaporized conducting material that transfer conducting material to the second region, wherein the second region partially or completely overlaps the first region and extends beyond the first region on the side corresponding to the overhang feature of the mask.

16 Claims, 15 Drawing Sheets

(56) References Cited

U.S. PATENT DOCUMENTS

| | | | |
|---|---|---|---|
| 6,255,775 B1 | 7/2001 | Ikuko et al. | |
| 6,417,034 B2 | 7/2002 | Kitazume et al. | |
| 6,513,451 B2 * | 2/2003 | Van Slyke et al. | 118/723 VE |
| 6,867,539 B1 * | 3/2005 | McCormick et al. | 313/504 |
| 7,442,258 B2 | 10/2008 | Kim | |
| 2007/0072337 A1 | 3/2007 | Matsuzaki et al. | |
| 2009/0110847 A1 * | 4/2009 | Amelung | 427/569 |
| 2009/0269486 A1 * | 10/2009 | Yamazaki et al. | 427/66 |
| 2011/0316013 A1 | 12/2011 | Boerner | |
| 2012/0064663 A1 | 3/2012 | Choi et al. | |

OTHER PUBLICATIONS

Written Opinion issued in PCT/US2014/010591 mailed May 5, 2014.

Hamer et al., "Apparatus and Method for Making OLED Lighting Device", Response to Written Opinion Submitted with Article 34 Amendments filed on Nov. 7, 2014 for PCT Application No. PCT/US2014/010591, 14 pages.

Written Opinion issued in PCT/US2014/010591, mailed Jan. 9, 2015.

International Preliminary Report on Patentability issued in PCT/US14/10591, mailed May 1, 2015.

* cited by examiner

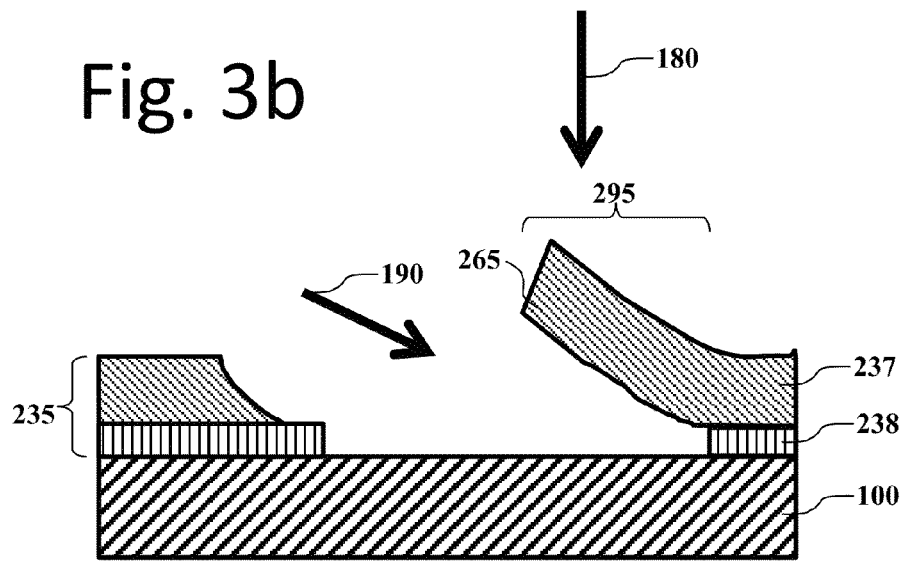
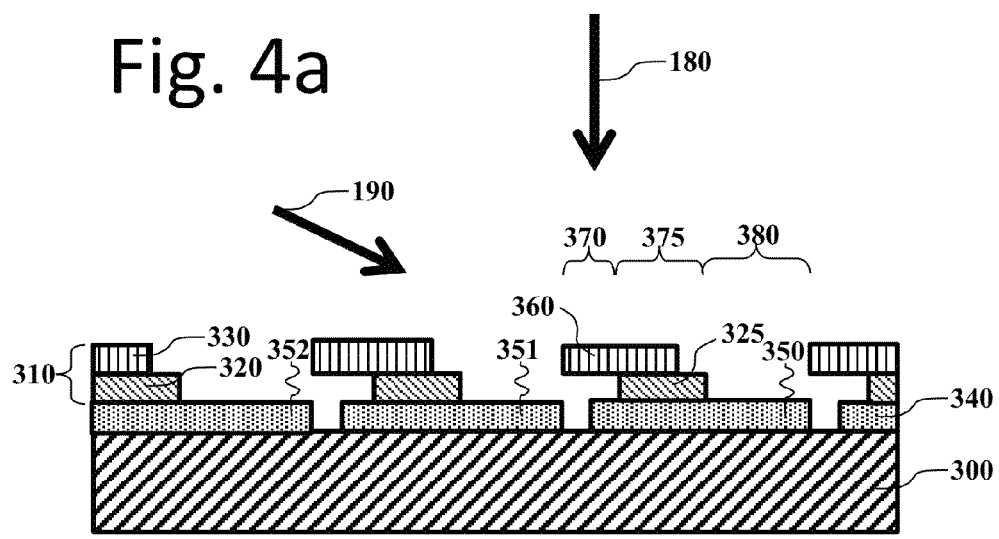

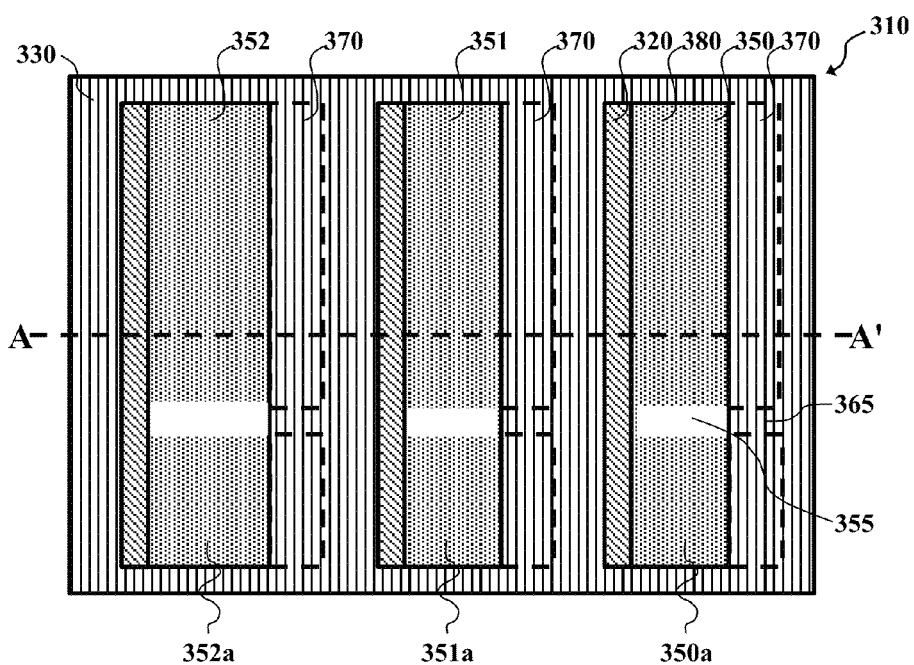

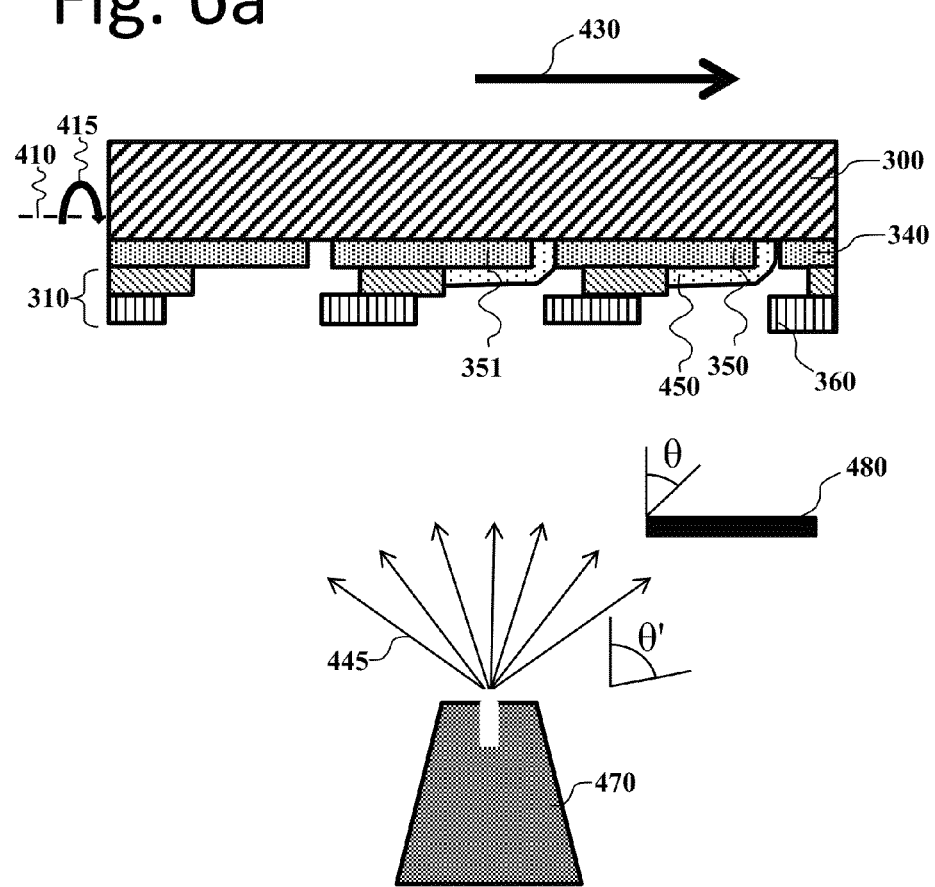

APPARATUS AND METHOD FOR MAKING OLED LIGHTING DEVICE

CROSS REFERENCE TO RELATED APPLICATIONS

This application is a continuation-in-part of application Ser. No. 13/736,870, filed 8 Jan. 2013, now abandoned.

INTRODUCTION

1. Field

This disclosure relates to the field of organic light-emitting devices (OLEDs) and their use for lighting, and in particular to an apparatus and method for the preparation of such devices. More specifically, this disclosure relates to a removable mask and apparatus for depositing a variety of layers of materials in different regions of a substrate surface to prepare an OLED, and methods for using the same.

2. Background

The field of OLED devices has drawn much attention in recent years. Such devices promise that OLEDs can be used for clear and vibrant displays, e.g. in televisions, smartphones, and other display-centric devices. Another area in which OLEDs hold promise is in the area of lighting. OLED panels could be used to replace large area lighting, e.g. overhead lighting. Advantages of such OLED lighting is that the panels can produce light with relatively low power requirements and little heat as a by-product, reducing electricity usage. Such panels also have the possibility of long lifetimes, reducing the need to replace the lamps at regular intervals. OLED lighting can also be made adjustable so that the lighting level can varied depending upon need.

Today the most successful method to make high performance OLEDs is by depositing the organic layers and the cathode using vacuum thermal evaporation. At least two shadow masks are required, one for the organic layer(s) and one for the cathode. Extra organic layer masks are required if different organic formulations are deposited on different regions of the substrate, e.g. to make different color subpixels to create RGB or RGBW displays. A separate cathode mask is required because the cathode must be deposited after the organic layer(s), but must be connected to traces already deposited on the substrate before any organic OLED layers. Therefore, the organic layer must be excluded from these cathode contact areas, while the cathode layer must then be deposited over these contact areas. The requirement to use at least two masks for organic layers and cathode has a number of disadvantages: 1) It interrupts the manufacturing flow. 2) Extra equipment is required to remove one mask and replace it. This is commonly done by moving the substrate from one mask frame (which holds the organic layer mask) to another mask frame holding the cathode mask. 3) It requires a second aligning process of the substrate to the new mask which can require expensive and elaborate equipment to achieve precise alignment. 4) It increases the possibility of particle generation during the mask transfer process, and such particles can result in shorts. For display devices, such as those used for computers, the necessity to create properly aligned RGB pixels, and the cost of the device the display will be used in (e.g. television, smartphone) can justify complex and costly manufacturing methods. OLED lighting devices must compete with well-established and relatively inexpensive lighting solutions such as incandescent and fluorescent. Complex and costly manufacturing methods become a hindrance to the use of OLEDs for lighting.

SUMMARY OF VARIOUS EMBODIMENTS

The present teachings provide apparatus and methods for the preparation of organic light-emitting devices on a substrate, and in particular organic light-emitting devices that can be used for lighting. Such devices differ from common OLED displays in that small individual pixels, often a mixture of RGB pixels and each controlled by an individual circuit, are not necessary. In contrast, an OLED lighting device can have a relatively large area, perhaps several square inches or even larger, wherein the entire area emits the same color light and is controlled by a single circuit. The present invention provides an apparatus and method for making such OLED lighting devices with improved ease of manufacturing and reduced manufacturing expense through a shadow mask together with vapor deposition apparatus. The particular features of the shadow mask and vapor deposition apparatus will become apparent. Such apparatus allows a single shadow mask placed against a substrate to be used to deposit organic layers on a first region of the substrate, and—without moving the mask—a conducting layer on a second region of the substrate, wherein said first and second regions of the substrate are partially but not completely overlapping for proper functioning of the lighting device.

The terms "mask" and "shadow mask" as used herein refer to a masking structure that most commonly comprises a thin sheet of material, most commonly metal, that includes a selected pattern of open and non-open areas that allow material to be deposited on a substrate in selected regions. This definition can include cases wherein two or more sheets of such material are used together as a single shadow mask, e.g. a first or lower mask and a second or upper mask, to provide certain desired properties, which will become evident. The term "removable mask" refers to a mask that is separate from the substrate, and can be placed against the substrate to allow coating of selected regions, and then can be readily removed, without additional chemical or physical treatment, when the coating or depositing operations are complete. Thus, the removable mask can be used to deposit material on a plurality of substrates. The terms "OLED" and "organic light-emitting device" are used in the sense well-known in the art, which is a device that includes a cathode, an anode, and a variety of intermediate layers between the cathode and anode, including at least one light-emitting layer comprising one or more organic materials.

Codama, in U.S. Pat. No. 6,091,196, issued Jul. 18, 2000, teaches a method of forming both organic layers and an electrode layer using a removable mask wherein the electrode layer covers a greater area than the organic layer, and thus forms an electrical connection between the electrode layer and an electrical contact located outside the area of the organic layers. The '196 patent teaches doing this with a first deposition process having poor intrinsic lateral spread, such as vacuum evaporation, for depositing the organic layer(s). The electrode layer is then deposited via a second process having a better intrinsic lateral spread, such as sputtering.

There are several problems with the approach of '196. One is that the broad-lateral-spread processes taught by '196 as the means for depositing the electrode layer are also high-energy processes that are known to damage underlying organic layers by high-energy collisions or UV/x-ray emissions. For this reason, it is very common in the art today that electrode materials are deposited via vacuum thermal deposition. Further, the '196 teachings require at least two different types of coating apparatus. This can be an added expense and complexity in situations wherein multiple layers of organic and electrode materials must be coated and a limited number of coating stations is available. A more desirable process would be one wherein the same type of coating process can be used for organic layers and electrode layers. Due to the potential damaging effects of coating processes such as sputtering, it would be further desirable that such process be vacuum thermal evaporation. However, such a method would entail both the organic layers and electrode layers being deposited by a process with the same intrinsic lateral spread, which would make impossible a single shadow mask for both depositions in the manner taught by '196. The '196 teachings thus cannot be applied to deposition of both organic layers and electrode layers by the same deposition method using a single shadow mask. It would be a more desirable situation to provide an apparatus and method that allows all of these conditions.

In various embodiments, this disclosure provides a removable mask with one or more openings that allow material to be deposited in selected regions of a substrate. The one or more openings have, on at least one edge, an overhang feature. For the purposes of this disclosure, an overhang feature is a portion of the mask that is above a substrate that the mask is placed in contact with, but such overhang feature itself does not directly contact the substrate. Masks, as well-known in the art, provide for masked and unmasked portions of a substrate when they are placed on the substrate. The overhang feature of the mask of the present disclosure further provides for a partially masked portion of the substrate, which can be considered masked from some perspectives, but unmasked from other perspectives, permitting selective material deposition on the partially masked portions. The utility of such selective deposition will become evident in this disclosure.

In some embodiments, the overhang feature is provided by selecting the openings in two individual masks to be partially offset relative to each other. Thus, a portion of an upper mask will be over the opening of a lower mask, creating an overhang feature that masks the substrate from some perspectives but not others, and is not in contact with the substrate. In various other embodiments, the overhang feature is provided by selecting the openings in the upper mask to be smaller than the openings in the lower mask. Thus, at least one edge of the upper mask will be over the opening of the lower mask, creating an overhang feature. The first or lower mask is understood to be the mask closest to the substrate. Although the figures are drawn for deposition on the upwards surface of the substrate, the figure can be rotated to apply to any substrate orientation, e.g. deposition of material from overhead or from the side.

In a variety of embodiments, the various other edges of the mask openings can be selected to be vertical. In other various embodiments, one or more of the other edges of the mask openings can be offset to provide a cutaway edge wherein the mask tapers down in thickness, either smoothly or in steps, towards the opening in the mask on the side in contact with the substrate. In various other embodiments, one or more of the other edges of the mask openings can be selected to include an additional overhang feature.

In a variety of other embodiments, the mask of this disclosure can be a one-piece mask wherein at least one edge of each mask opening has an overhang feature. The overhang feature is provided by an edge to the mask openings that is not normal or vertical to the substrate surface. In some embodiments, at least one edge of the mask opening is sloping at an angle other than 90° relative to the top and bottom of the mask to provide an overhang feature. In other various embodiments, at least one edge of each mask opening can be formed in the shape of an arc to provide an overhang feature. In other various embodiments, at least one edge of each mask opening is formed in a stepwise fashion to provide an overhang feature.

In the variety of embodiments of this disclosure, this disclosure provides any of the above embodiments of mask aligned on the surface of a substrate. A variety of substrates can be used, and can include prepatterned layers, and particularly electrical connections. These connections, which are patterned onto the insulating substrate before the organic deposition, provide a common method to connect the OLED light emitting area to the external panel electrical connections, which are outside the emitting areas, and outside an encapsulation seal, which is commonly used in OLED devices. This disclosure also provides a source of vaporized organic material, which provides the vaporized organic material in a controlled directional manner, in a first orientation relative to the substrate and mask. The orientation of the organic material vapor source is selected such that organic material is deposited on a first region of the substrate, where the first region includes only limited deposition in the partially masked portion of the substrate. In various embodiments of this disclosure, the deposition of organic material can be repeated with a variety of organic materials, to produce a desired layered structure on the first region of the substrate. Each layer can have a different desired thickness and thickness range required to achieve uniform desired characteristics of the light emissions. In some embodiments, one or more of these layers can be deposited by two or more organic material vapor sources in the first orientation, such that the resulting layer of organic material comprises a mixture of two or more organic materials in a desired ratio.

In the variety of embodiments of this disclosure, this disclosure further provides a source of vaporized conductive material in a second orientation relative to the mask and to the substrate, upon which one or more organic layers have been deposited on a first region. The source provides a plume of vaporized conductive material having desired directional features and directed from the source to the substrate and mask. The source of vaporized conductive material can be the same type of source as used to deposit organic materials (e.g. vacuum thermal evaporation) and have the same intrinsic plume characteristics. The orientation of the conductive material vapor source is selected such that conductive material is deposited on a second region of the substrate, where the second region includes some or all of the partially masked portion of the substrate, and the partially masked portion of the substrate includes an electrical connection for the conducting material. Thus, this disclosure provides a variety of embodiments for depositing organic material in layers with substantially uniform composition and thickness in a first region of a substrate, and conducting material in a second region of the substrate, wherein the two regions are partially but not completely overlapping, utilizing a single removable mask or mask assembly. This simplifies the manufacture of such OLEDs, and reduces or eliminates many of the disadvantages of using multiple masks. This disclosure also provides exemplary device embodiments prepared by this apparatus.

In this disclosure, the conductive material deposited on over the organic layers will be referred to as the upper electrode, the top electrode, or the cathode. However, those skilled in the art will understand it can also refer to the anode of an inverted OLED structure where the electrons are injected from the electrode closest to the substrate. The conductive electrode deposited by the apparatus and method of this disclosure can also be an intermediate electrode in a stacked OLED wherein OLED devices are formed both above and below this conductive layer, as is well-known in the art. In the case of a stacked OLED with multiple independently controllable vapor deposited electrodes, there can be connections to the multiple electrodes on different edges of the mask opening.

In a variety of embodiments, this disclosure provides exemplary methods for providing an organic light-emitting device using an apparatus as described in this disclosure. According to various embodiments, the method can include the steps of: providing a substrate with conductive areas and insulating areas patterned upon it; placing a mask in contact with the substrate, wherein the mask openings have at least one edge structured to have an overhang feature; exposing the mask and substrate under vacuum to one or more sources of vaporized organic material, wherein the source(s) have a defined directional plume shape and are in a first orientation relative to the mask and substrate; without moving the mask relative to the substrate exposing the mask and substrate under vacuum to one or more sources of vaporized conductive material, wherein the source(s) have a defined directional plume shape and are in a second orientation relative to the mask and substrate; and removing the mask from the substrate. In various other embodiments, the organic vapor source(s) and the conductive material vapor sources have a broader plume shape and can be in a similar orientation relative to the mask and substrate. In these embodiments, a shield on one side of the vapor plume can be used to shape the directionality of the organic material vapor plume.

Advantages

It is an advantage of this invention that, in the manufacture of a large-scale OLED lighting device, it permits the deposition of organic material and conducting material in the vapor phase, over different but partially overlapping regions, utilizing a single shadow mask placed once against the substrate. This has the further advantage of simplifying manufacturing steps and reducing manufacturing costs.

BRIEF DESCRIPTION OF THE DRAWINGS

These and other embodiments of the disclosure will be discussed with reference to the following exemplary and non-limiting illustrations, in which like elements are numbered similarly, the illustrations are scaled for ease of visualization and not necessarily for dimensional accuracy, and where:

FIG. 3b shows a cross-sectional view of another embodiment of a mask with an overhang feature that is useful in the present invention;

FIG. 4a shows a cross-sectional view of another embodiment of a mask with a plurality of overhang features on a substrate with multiple electrical connections;

FIG. 4b shows a plan view of the mask and substrate of FIG. 4a;

FIG. 6a shows a cross-sectional view of the mask and substrate of FIG. 4a in relation to another embodiment of a source for depositing vaporized organic materials upon the substrate;

DESCRIPTION

Figure 1A:
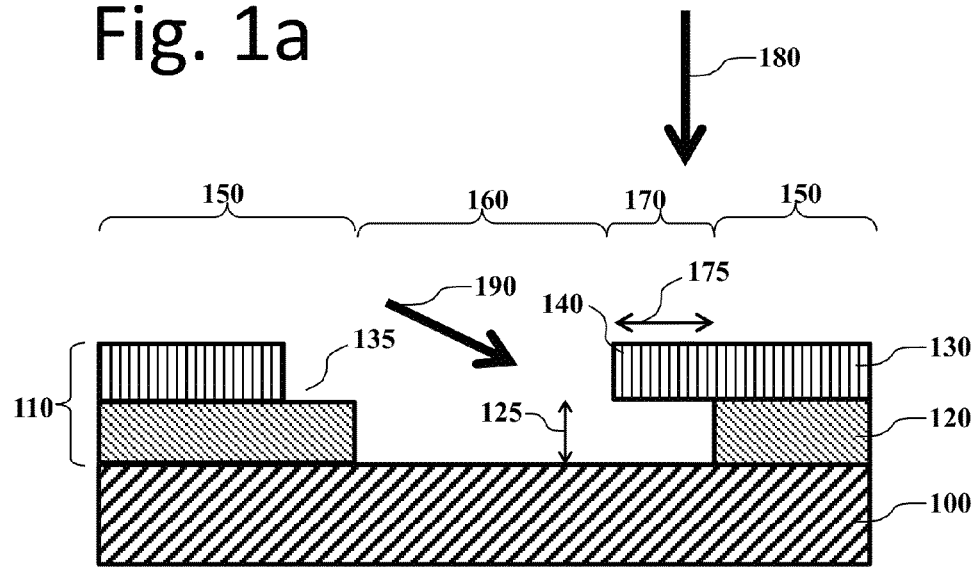
FIG. 1a shows a cross-sectional view of a first embodiment of a mask with an overhang feature that is useful in the present invention.

Turning now to FIG. 1a, there is shown a cross-sectional view of a first embodiment of a removable or reusable mask 110 with an overhang feature that is useful in the present invention. Mask 110 is positioned on or against substrate 100. Substrate 100 and other substrates useful in this invention can be an organic solid, an inorganic solid, or a combination of organic and inorganic solids, and can be rigid or flexible. Typical substrate materials include glass, plastic, metal, ceramic, semiconductor, metal oxide, semiconductor oxide, semiconductor nitride, low-temperature polysilicon, amorphous-silicon, or combinations thereof. The substrate can either be light transmissive or opaque, depending on the intended direction of light emission. The light transmissive property is desirable for viewing the light emission through the substrate. Transparent glass or plastic are commonly employed in such cases. For applications where the light emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices. It will be understood that substrate 100 can have other surface features, such as electrical traces and insulator regions or other layers already deposited and patterned. Besides patterned electrical traces, conductive features can include the use of the conductive properties of the substrate. For simplicity the embodiments described here will be based on insulating substrates such as glass or polymer materials. Common ways of depositing conductive features are by use of sputtering, evaporation, chemical vapor deposition, ink jet coating, aerosol jet coating, slot die coating, or spin coating. These layers can be patterned during deposition, as in ink jet coating and aerosol jet coating, or they can be patterned by use of shadow masks, or they can be patterned by removing materials through methods such by selective etching of materials not protected by removable resist materials. These electrically conductive and insulating features are not shown here for clarity of illustration. Mask 110 is not bonded to substrate, that is, it is readily physically removable simply by lifting, without additional chemical or physical treatment, and reusable for subsequent operations with additional substrates. Mask 110 is positioned and held in contact with substrate 100, which means that one surface of mask 110 is in substantial contact with a surface of substrate 100, but that small imperfections in the surfaces of substrate 100 and mask 110 can mean that relatively small portions of the contacted surfaces are not completely touching. Such substantial but not complete contact does not affect this invention. For the purposes of this disclosure, such substantial contact with a substrate will include embodiments wherein the surface of the substrate includes other preformed features, e.g. prepatterned electrical features.

A means of holding masks in contact with a substrate during vapor deposition can be useful in the embodiments of this disclosure. One common exemplary technology for holding masks in contact with a substrate is the use of magnetic force generated by magnetic elements placed on the backside of the substrate. The magnetic force can be adjusted to prevent damage to the substrate by adjusting the number and pattern of the magnetic elements and their space from the substrate. At the end of the deposition process, the magnetic elements can be moved away from the substrate in order to more easily separate the masks from the substrate in a manner that does not damage or distort the masks.

This embodiment of mask 110 is a unified mask comprising two individual masks, a first or lower mask 120 and a second or upper mask 130. Lower mask 120 and upper mask 130, and all masks of this disclosure, comprise thin sheets of sturdy material, most commonly metal. Usefully, such sheets have a thickness of from 50 to 1000 micrometers, and suitably a thickness of from 100 to 300 micrometers. The sheets comprising the different layers can have different thicknesses and can be made of different materials, for example materials with different magnetic susceptibilities to facilitate magnetic holding methods. Lower mask 120 is substantially in contact with substrate 100, while upper mask 130 is substantially in contact with lower mask 120. Lower mask 120 and upper mask 130 can be bonded together or can be separable from each other. Lower mask 120 and upper mask 130 are structured and positioned together in such a way to form an overhang feature 140. For the purposes of this disclosure, an overhang feature is defined as one edge of a mask open area that is above the substrate but is not in direct contact with the surface of the substrate. Thus, the portion of mask 110 represented by lower mask 120 is in direct contact with substrate 100, while overhang feature 140, a part of upper mask 130, is above and separated from the substrate by distance 125. Usefully, distance 125 is from 50 to 1000 micrometers, and suitably from 100 to 300 micrometers. In the embodiment of FIG. 1a, distance 125 is equal to the thickness of lower mask 120. In the series of embodiments wherein the mask comprises two or more individual masks, such as mask 110 in FIG. 1a, the overhang feature can be provided by offsetting the edges of the various individual masks that together form one edge of the open area of the mask. For example, the edges of upper mask 130 and lower mask 120 are offset by a distance 175 on one edge of open area 160. Masks commonly used in the art provide for two different regions or portions on a substrate: masked portions wherein the mask is in contact with the substrate and thus prevents material deposition, and unmasked portions provided by mask openings, wherein material is allowed to be deposited. The overhang feature of mask 110 divides the surface of substrate 100 into three distinct portions: one or more masked portions 150 wherein mask 110 is in substantial contact with the surface of substrate 100, one or more unmasked portions 160 wherein the mask is not in contact with or and does not block or obscure the surface of substrate 100, and one or more partially masked portions 170 wherein mask 110 is not in contact with the surface of substrate 100 but overhang feature 140 blocks or obscures the surface of substrate 100 from selected directions or perspectives. For example, partially masked portion 170 is obscured by overhang feature 140 from perspective 180, but not from perspective 190. It will be understood by those skilled in the art that the exact locations and boundaries of unmasked portions 160 and partially masked portions 170 depend upon the perspectives chosen and the dimensions of the features of mask 110, and thus FIG. 1a merely shows one possible embodiment of these portions that can be provided by mask 110. The width of overhang feature 140, represented by distance 175, can be in the range of from 1× to 5× distance 125. The utility of such partially masked portions and selected perspectives to deposit one material or group of materials (e.g. organic materials) in a first region and a second material or group of materials (e.g. conducting materials) in a second partially overlapping region will become evident.

Other edges of the mask openings can have properties as desirable to allow desired material deposition. For example, mask 110 has cutaway edge 135, which is a positively sloped edge, on one or more other edges of the mask openings. Masks with such positively sloped edges are common in the art. Both overhang feature 140 and cutaway edge 135 can be provided by selecting mask openings in lower mask 120 and upper mask 130 to be partially offset relative to one another.

Figure 1B:
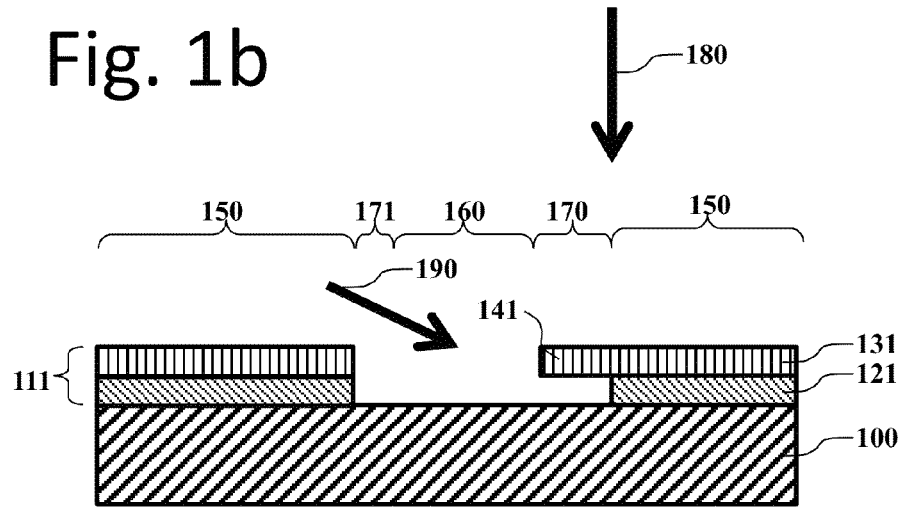
FIG. 1b shows a cross-sectional view of another embodiment of a mask with an overhang feature that is useful in the present invention.

Turning now to FIG. 1b, there is shown a cross-sectional view of another embodiment of a mask with an overhang feature that is useful in the present invention. Mask 111 comprises two individual masks, a first or lower mask 121 and a second or upper mask 131. Lower mask 121 and upper mask 131 are structured and positioned together in such a way to form an overhang feature 141. In this mask embodiment, the opposite edges of the two masks (shown on the right in this orientation) provide a single vertical edge. Depending upon the thickness of masks 121 and 131, this can create a second partially masked portion 171 from some perspectives, e.g. perspective 190. Both overhang feature 141 and the vertical edge can be provided by selecting mask openings in lower mask 120 to be larger than mask openings in upper mask 130.

Figure 1C:
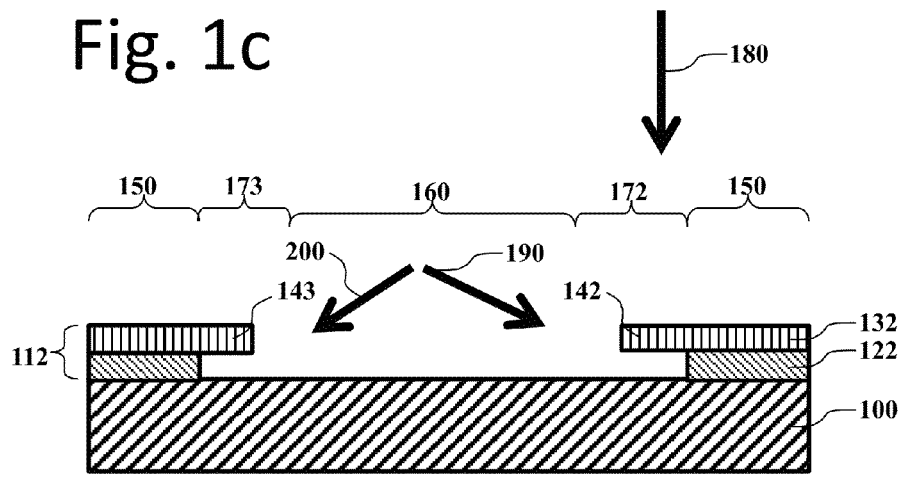
FIG. 1c shows a cross-sectional view of another embodiment of a mask with an overhang feature that is useful in the present invention.

Turning now to FIG. 1c, there is shown a cross-sectional view of another embodiment of a mask with an overhang feature that is useful in the present invention. Mask 112 comprises two individual masks, a first or lower mask 122 and a second or upper mask 132. Lower mask 122 and upper mask 132 are structured and positioned together in such a way to form overhangs 142 and 143. With a combination of perspectives, e.g. perspectives 190 and 200, this can create partially masked portions 172 and 173 on substrate 100.

Figure 2A:
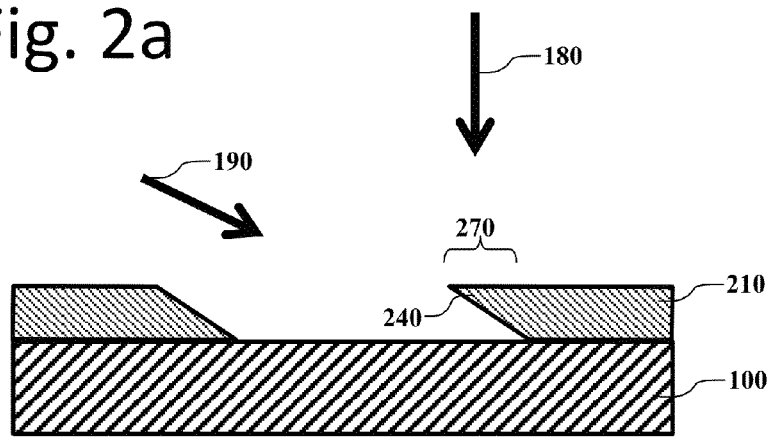
FIG. 2a shows a cross-sectional view of another embodiment of a mask with an overhang feature that is useful in the present invention.

It is not necessary for the purposes of this invention that the mask comprise multiple separate masks. Turning now to FIG. 2a, there is shown a cross-sectional view of another embodiment of a mask with an overhang feature that is useful in the present invention, wherein the mask comprises a single unit and one edge of open areas of the mask can be structured to provide the overhang feature. Mask 210 has sides which are formed at an angle other than 90° to the top and bottom of mask 210, e.g. by cutting or etching the edges. This forms overhang feature 240, which forms partially masked portion 270 on substrate 100, relative to perspective 180. Such features in this and other single-unit mask embodiments described herein can be prepared by commercially available two-sided etching.

Figure 2B:
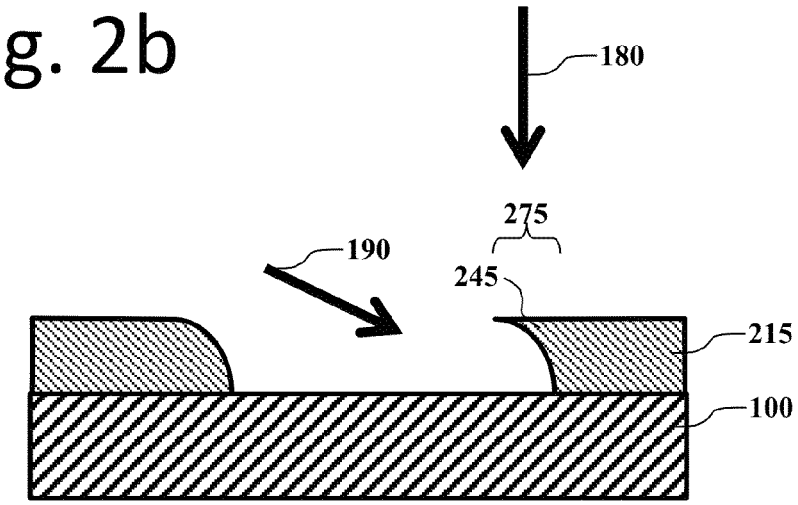
FIG. 2b shows a cross-sectional view of another embodiment of a mask with an overhang feature that is useful in the present invention.

Turning now to FIG. 2b, there is shown a cross-sectional view of another embodiment of a mask with an overhang feature that is useful in the present invention, wherein the mask comprises a single unit. Mask 215 has sides which have been cut or etched in an arc shape to form sides that are not at an angle of 90° relative to the top and bottom of mask 215. This forms overhang feature 245, which forms partially masked portion 275 on substrate 100, relative to perspective 180.

Figure 2C:
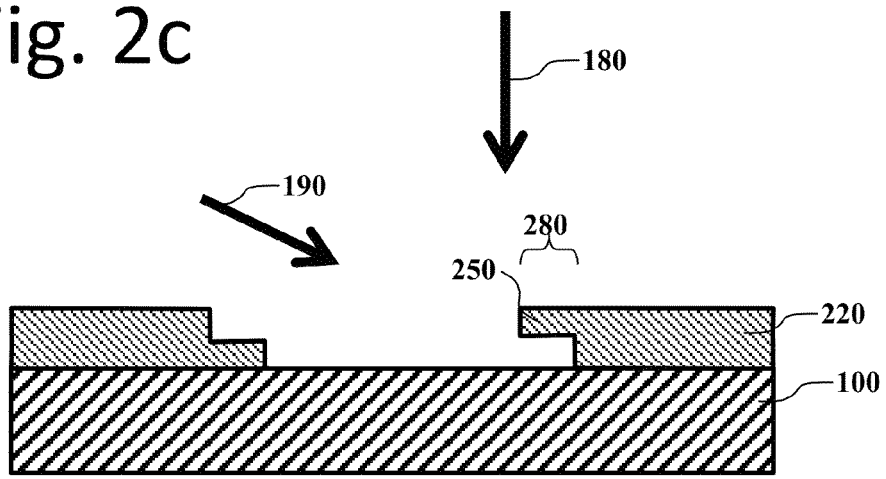
FIG. 2c shows a cross-sectional view of another embodiment of a mask with an overhang feature that is useful in the present invention.

Turning now to FIG. 2c, there is shown a cross-sectional view of another embodiment of a mask with an overhang feature that is useful in the present invention, wherein the mask comprises a single unit. Mask 220 has sides which have been cut or etched in a step shape relative to the top and bottom of mask 220. This forms overhang feature 250, which forms partially masked portion 280 on substrate 100, relative to perspective 180. Mask 220 is analogous to mask 110 of FIG. 1a, except that mask 220 is a one-piece mask. It will be understood that any mask that can be formed of two or more separate masks (e.g. masks 111 and 112 of FIGS. 1b and 1c, respectively) can also be fabricated as a single unit.

Figure 2D:
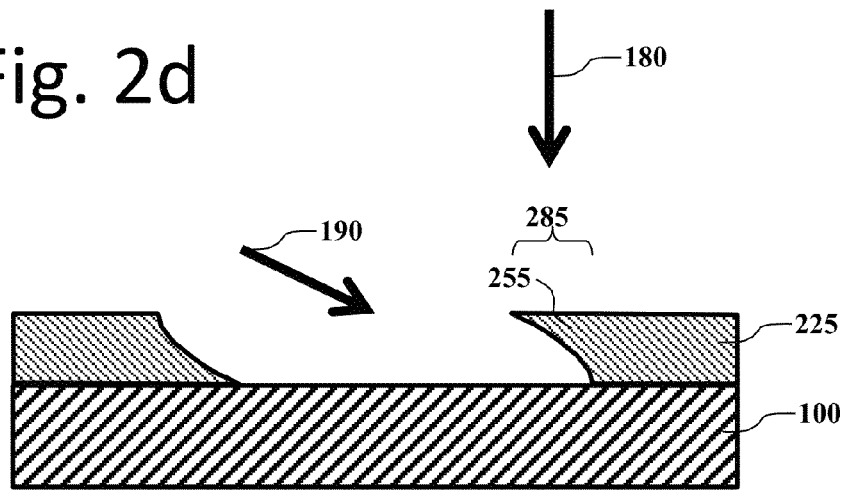
FIG. 2d shows a cross-sectional view of another embodiment of a mask with an overhang feature that is useful in the present invention.

Turning now to FIG. 2d, there is shown a cross-sectional view of another embodiment of a mask with an overhang feature that is useful in the present invention, wherein the mask comprises a single unit. Mask 225 has sides which have been cut or etched in an arc shape to form sides that are not at an angle of 90° relative to the top and bottom of mask 225. This forms overhang feature 255, which forms partially masked portion 285 on substrate 100, relative to perspective 180.

Figure 3A:
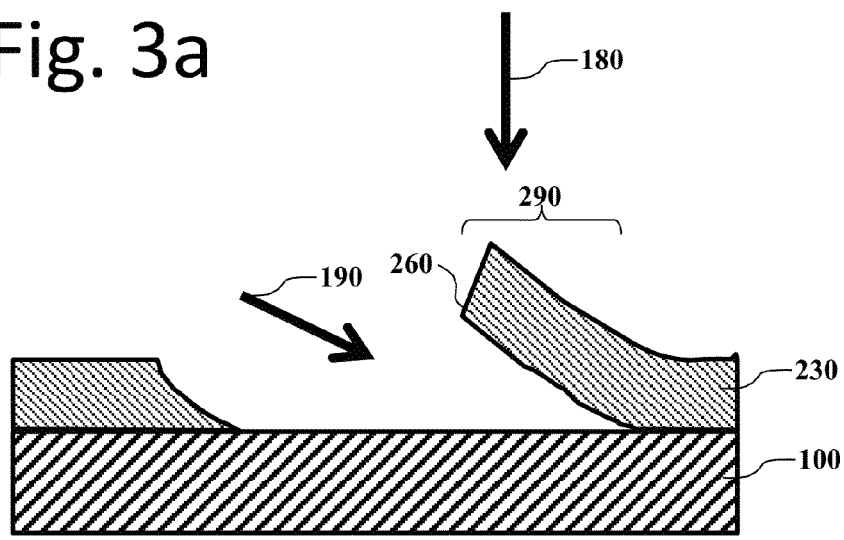
FIG. 3a shows a cross-sectional view of another embodiment of a mask with an overhang feature that is useful in the present invention.

Turning now to FIG. 3a, there is shown a cross-sectional view of another embodiment of a mask with an overhang feature that is useful in the present invention, wherein additional mask shapes can be impressed into what is typically a flat mask sheet to give it rigid three-dimensional features. Mask 230 is bent on one edge of the open area to form overhang feature 260, defining partially masked portion 290. This embodiment allows a wider cathode contact area by allowing a larger overhang feature without using thicker mask materials. Wider cathode contact areas permit greater operating currents and are therefore useful for large-sized emitting areas. Turning now to FIG. 3b, there is shown a cross-sectional view of another embodiment of a mask with an overhang feature that is useful in the present invention, similar to mask 230 of FIG. 3a. Mask 235 comprises upper mask 237 and lower mask 238. In this embodiment, lower mask 238 is planar, enabling it to retain good contact with substrate 100, while upper mask 237 is selected of material suitable to be formed with three-dimensional structures, e.g. overhang feature 265, thereby providing partially masked portion 295.

The present invention is not limited to the previous examples. In addition to the various mask shapes shown in the previous examples, those skilled in the art can readily conceive of other mask shapes with an overhang feature that can provide a partially masked portion on a target substrate.

Turning now to FIG. 4a, there is shown a cross-sectional view of another embodiment of a mask with a plurality of mask openings and overhang features on a substrate with multiple electrical connections. Substrate 300 includes a prepatterned cathode lead 340 and prepatterned anodes 350, 351, and 352. Mask 310 comprises a first or lower mask 320 and a second or upper mask 330, but it will be understood that a variety of the mask embodiments disclosed herein can be used this way. The upper and lower masks are so structured to have a plurality of openings 380 corresponding to each anode. Each opening is so structured to have an overhang feature 360 such that partially masked portion 370 of substrate 300 is obscured by overhang feature 360 from perspective 180, but not from perspective 190. The structure of mask 310 thus defines a plurality of such partially masked portions, as well as a plurality of masked portions, which are those covered by first mask 320, and a plurality of unmasked portions, which in this embodiment are the same as mask openings 380. Partially masked portions 370 are selected to be over a portion of cathode lead 340 and anodes 350 and 351. The utility of this will be further demonstrated.

Turning now to FIG. 4b, there is shown a plan view of mask 310 on substrate 300 of FIG. 4a. Line A-A' represents the cross-sectional view of FIG. 4a. In the view of FIG. 4b, it is primarily the second mask 330 that is visible, with mask openings 380 and portions of first mask 320 also visible. Mask openings 380 make visible the unmasked portions of the anodes of FIG. 4a, e.g. anodes 350, 351, and 352. Also indicated are the partially masked portions 370 created by the overhang features 360 of FIG. 4a. FIG. 4b further shows another optional embodiment useful in this invention. It can be useful in OLED lighting devices to provide multiple series electrical connections in parallel to each other. Thus, anodes 350, 351, and 352 will form a first series connection, while anodes 350a, 351a, and 352a will form a second series connection in parallel with the first series connection. Such parallel connections must be insulated from each other, e.g. by gap 355 on the substrate. In such a case, it can be useful to prevent deposition of material under an overhang feature by providing for non-overhang regions 365, which are provided by the lower mask. If necessary, such non-overhang regions can be extended across mask openings 380 so as to completely cover and prevent deposition upon gaps 355.

Figure 5A:
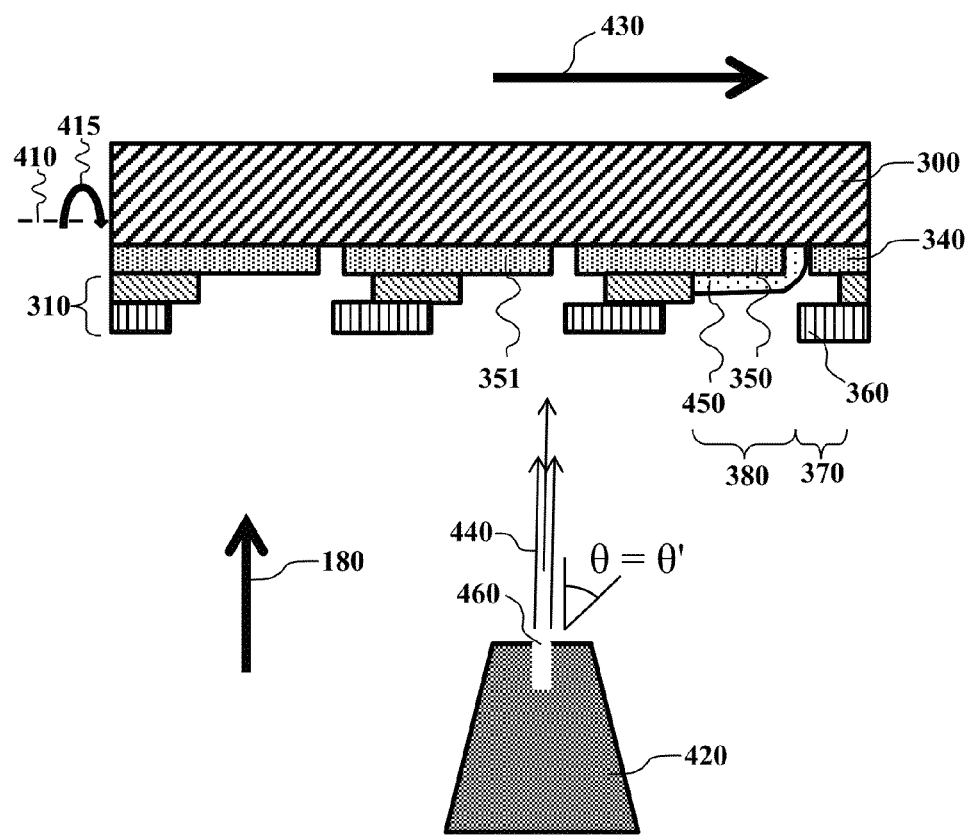
FIG. 5a shows a cross-sectional view of the mask and substrate of FIG. 4a in relation to one embodiment of a source for depositing vaporized organic materials upon the substrate.

Turning now to FIG. 5a, there is shown a cross-sectional view of the mask and substrate of FIG. 4a in relation to one embodiment of a source for depositing vaporized organic materials upon the substrate in a vacuum chamber (not shown). Relative to FIG. 4a, mask 310 and substrate 300, with its cathode lead 340 and plurality of anodes (e.g. 350), has been rotated along axis 410, shown by rotation 415. Organic material vapor source 420 is a source of vaporized organic material 440. Such vapor sources are well-known in the art. It is desirable for the purposes of this invention that source 420 belong to a class of vaporizing devices that can vaporize both organic and non-organic (e.g. metal) materials, and can deposit layers of these materials such that previously deposited layers are not damaged. Such a class includes vacuum thermal evaporation devices. Source 420 includes a reservoir of organic material, which is heated to vaporize it such that it is emitted by one or more nozzles 460. In the embodiments of a plurality of nozzles 460, such nozzles can form a linear array that is disposed normal to the plane represented by FIG. 5a.

The organic material is selected to form one or more layers of the OLED lighting device upon the substrate. The plume of vaporized organic material in the various embodiments of this disclosure is shaped on the side corresponding to overhang feature 360 of the mask (that is, on the right side of FIG. 5*a*) so as to limit transfer of organic material to angles less than or equal to a selected cutoff angle θ, which is measured relative to the normal to the substrate surface on that side. As will be seen, such shaping can be done by selecting a vaporization device to produce an intrinsic plume shape, and by selecting additional factors such as source orientation or shields selectively placed in the vapor path. It is well-known in the art that the intrinsic plume shape of vacuum thermal evaporation devices can be controlled by varying factors in device design such as the length-to-diameter ratio of the nozzles. For example, a general description of plume flux distribution is given in equation (1) of U.S. Pat. No. 7,645,483, by Grace et al. Those skilled in the art will recognize that the intrinsic width of the vapor plume shape, and hence the cutoff angle, can be defined in many ways. A practical definition is that the cutoff angle is the angle of a region about the vapor plume centerline within which some specified fraction of the total flux is contained. A graphical reference of the effect of one design parameter of the vaporizer—the ratio of nozzle tube length to its diameter—is shown in the common text "A User's Guide to Vacuum Technology", 2nd edition, by John F. O'Hanlon, 1989, John Wiley and Sons, Inc, ISBN 0-471-81242-0, on Page 45. The chart shows the result for nozzle exit tube length-to-diameter ratios of 0, 1, 3, 5, and 10. A higher length-to-diameter ratio provides a more directional plume. Thus, the vapor plume will have a defined distribution that can be selected by vaporization device design to be broad or narrow, as suited to the intended application. For the purpose of this disclosure, for symmetric vapor plumes, the angle from the plume centerline defining a region that includes 90% of the total flux of vapor will be referred to as the intrinsic cutoff angle θ' of the vaporization device. In contrast, the selected cutoff angle θ is the chosen maximum angle of vapor distribution in a selected direction. The selected cutoff angle θ depends in part upon the vaporization device's intrinsic cutoff angle, but can also depend upon above-referenced factors such as the orientation selected for the source and shields placed in the vapor path. In the embodiment shown in FIG. 5*a*, the centerline of the plume of source 420 is normal to the substrate surface so θ can also be measured from the plume centerline. In general for embodiments typified by FIG. 5*a*, the selected cutoff angle with respect to the substrate normal on the side of the overhang feature will be determined by both the vapor plume's intrinsic cutoff angle, which is measured relative to the vapor plume centerline, and the orientation of the source. The selected cutoff angle θ will be further discussed below. In the embodiment of FIG. 5*a*, such shaping is done by causing vaporized organic material 440 to be emitted from nozzle 460 with a highly directional plume shape, which will of course reduce transfer of organic materials at angles greater than θ in all directions. In the embodiment of FIG. 5*a*, angle θ' is the intrinsic cutoff angle of source 420, and also (because source 420 is normal to the surface of substrate 300) the selected cutoff angle θ. The intrinsic cutoff angle can be between 30° and 60°, and suitably between 40° and 50°, relative to normal to substrate 300. For the purposes of this disclosure, a source that provides a vapor plume with an intrinsic cutoff angle meeting these criteria will be referred to as a narrow source. In order for the vapor molecules to proceed in molecular flow with a small number of intermolecular interactions before reaching the substrate, the pressure in the chamber is desirably below 1E-4 torr, and suitably below 1E-5 torr for large chambers and substrates, in order to limit the amount that the ideally defined plume shape broadens at high vapor flow rates. The nozzle in the opening of the vaporizer can be designed to create a largely unidirectional beam of molecules as shown in FIG. 5*a*. The more unidirectional the desired plume, the higher the temperature required within the source.

The vaporized organic material source is in a first orientation relative to the substrate and mask. The orientation of organic material vapor source 420, and in particular its nozzle (s) 460, is selected in this embodiment to be parallel to perspective 180, that is approximately perpendicular to the surface of substrate 300. In this orientation, vaporized organic material 440 can be deposited through exposed areas of mask 310, e.g. through mask opening 380, onto a first region comprising unmasked portions of substrate 300, e.g. the region of mask opening 380. The deposition region is determined by the design of the source, the mask, and in some embodiments to be further disclosed, a shield. Although the apparatus of FIG. 5*a* can theoretically restrict deposition of material to that of mask opening 380, non-idealities in the vapor flux of the plume and the contact of the mask to the substrate can cause minor amounts of vaporized organic material 440 to be deposited onto partially masked portion 370. This is shown by organic material 450, which is deposited on the open area of anode 350, and to a very limited extent onto partially masked portion 370 provided by overhang feature 360. In some cases, small amounts of organic material can be deposited onto the electrical connections, e.g. cathode lead 340. Such minor amounts of organic material still allow effective electrical connection of subsequent conductive layers and are not detrimental to the operation of the final OLED lighting device. In this and other embodiments of organic material deposition apparatus, the first region represented by mask opening 380 is defined as the area where substantially all of the organic material deposits. Those skilled in the art will understand that organic material will also be deposited onto the surface of mask 310; this is not shown for clarity.

Vaporized organic material can be deposited substantially uniformly through mask openings 380 by making the distance between organic material vapor source 420 and substrate 300 great enough, or by providing relative motion 430 between organic material vapor source 420 and substrate 300 with mask 310, or both. In the case of providing relative motion, organic material can be deposited sequentially through a series of mask openings 380. In FIG. 5*a*, organic material has been deposited over anode 350, and the relative motion of the substrate and mask will next deposit organic material over anode 351. While relative motion 430 is shown in one direction (that is, toward the right), it will be understood that motion in the reverse direction is equally effective.

Organic material 450 can be any material useful in a layer of an OLED device, as well-known in the art, other than the anode or cathode layers. This can include materials useful in hole-injecting layers (HIL), hole-transporting layers (HTL), light-emitting layers (LEL), electron-transporting layers (ETL), or electron-injecting layers (EIL). Such organic materials are well-known in the art; see for example U.S. Pat. No. 7,564,182 by Boroson et al., and references therein. The organic material can be a single material or can be a mixture of materials useful to the function of the particular layer. Organic material vapor source 420 can be a single source with one or more nozzles 460. Alternatively, organic material vapor source 420 can comprise two or more individual sources with different materials in close proximity, so that the resulting deposited organic material 450 can be a mixture of such materials, or can be primarily one material with a small amount of a desired dopant. The deposition shown in FIG. 5*a* can be repeated with different materials in the same vacuum chamber or a different vacuum chamber to deposit multiple organic layers on the unmasked portions of substrate 300. In this way, the apparatus of FIG. 5*a* can be utilized to produce the complete organic layers of an OLED lighting device. This can include multiple light-emitting layers, e.g. a blue LEL, a green LEL, and a red LEL, with intervening electron-transporting layers and hole-transporting layers, to form a device that will emit white light when complete.

It will be understood that various additional devices can be used in FIG. 5*a*, e.g. devices for supporting substrate 300 over source 420 in the configuration shown in FIG. 5*a*, and for providing relative motion between substrate 300 and source 420. Those skilled in the art will be able to conceive of various devices, well-known in the art, for such purposes. This invention is not intended to be limited to any particular support and transport devices. Further, those skilled in the art will understand that other configurations of the apparatus of FIG. 5*a* are possible, e.g. a configuration wherein organic material vapor source 420 deposits material from above, or horizontally onto a vertically oriented substrate.

Figure 5B:
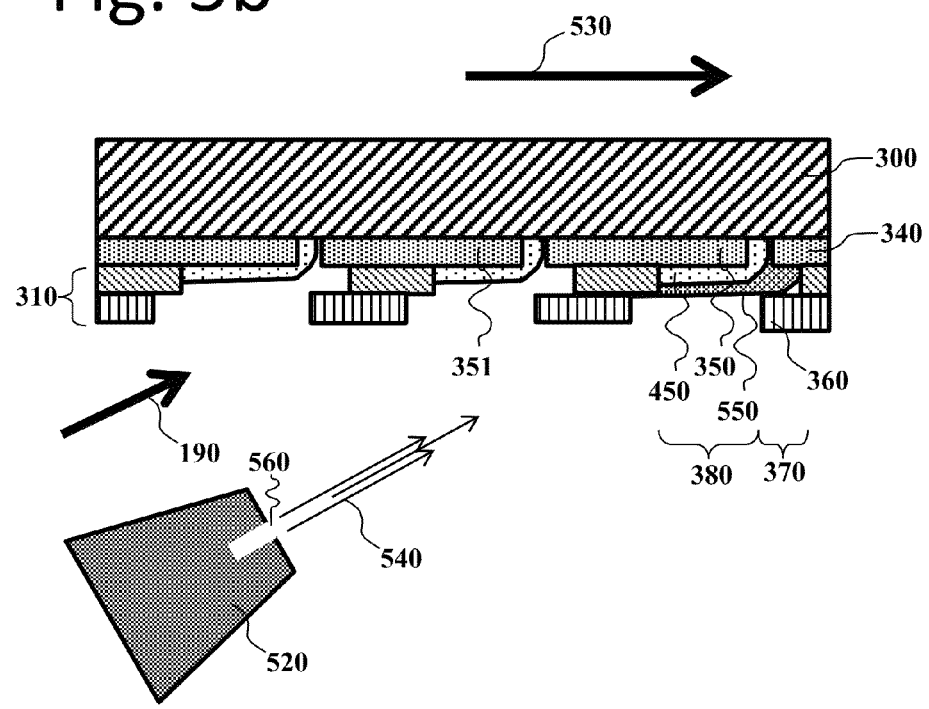
FIG. 5b shows a cross-sectional view of the mask and substrate of FIG. 4a in relation to one embodiment of a source for depositing vaporized cathode material upon organic material already deposited upon the substrate.

Turning now to FIG. 5*b*, there is shown a cross-sectional view of the mask and substrate of FIG. 4*a* in relation to one embodiment of a source for depositing vaporized conducting material upon organic material already deposited upon the substrate. Although exemplary embodiments herein use the deposited conducting material as a cathode, those skilled in the art will understand that this apparatus can deposit material suitable as an anode in an inverted OLED structure, or material suitable as in intermediate electrode in a stacked OLED structure. Such apparatus is in a vacuum chamber (not shown), which can be the same vacuum chamber as in FIG. 5*a*, or a different chamber. One or more layers of organic material, e.g. organic material 450, sufficient to form the organic layers of an OLED device, have been deposited onto substrate 300 through mask openings 380 via the apparatus of FIG. 5*a*. Conducting material vapor source 520 is a source of conducting material in the form of vaporized conducting material 540. It is desirable for the purposes of this invention that source 520 belong to a class of vaporizing devices that can vaporize both organic and non-organic (e.g. metal) materials, and can deposit layers of these materials such that previously deposited layers are not damaged. Such a class includes vacuum thermal evaporation devices. It can be further useful, for reasons of cost and simplicity, that source 520 belong to the same class of vaporizing devices and be selected to have similar or substantially the same vapor plume shape and intrinsic cutoff angle as source 420 above. Source 520 in this embodiment includes a reservoir of conducting material, which is heated to vaporize it such that it is emitted by one or more nozzles 560. Vaporized conducting material 540 is emitted from nozzle 560 in a highly directional plume shape by the use of a high vacuum and suitable temperature.

The vaporized conducting material source is in a second orientation relative to the substrate and mask. The orientation of conducting material vapor source 520, and in particular its nozzle(s) 560, is selected to be parallel to perspective 190. In this orientation, vaporized conducting material 540 can be deposited through exposed areas of mask 310, e.g. through mask opening 380, including under overhang feature 360. Thus, vaporized conducting material 540 can be deposited onto a second region including unmasked and partially masked portions of substrate 300. This is shown by conducting material 550, which is deposited on an unmasked portion (mask opening 380) and a partially masked portion 370, and therefore is in contact with cathode lead 340. Effective electrical contact is made between the conductive layer, e.g. conducting material 550, and cathode lead 340, even in the case where minor amounts of organic materials have been deposited onto cathode lead 340. Vaporized conducting material 540 will not be deposited onto masked portions of the substrate, e.g. where mask 310 is in substantial contact with substrate 300 or its substituent features such as anodes except in minor amounts due to non-idealities of the flux of the vapor plume and the attachment of the mask to the substrate. A circuit is thus formed by cathode lead 340, conducting material 550, organic material 450 (sufficient to form the organic layers of an OLED device), and anode 350. This thus creates a complete OLED device, above anode 350, through the use of a single mask for deposition both organic material layers in a first region and conducting material layers in a second region. Relative motion 530 between conducting material vapor source 520 and substrate 300 with mask 310, as disclosed above, can sequentially deposit conducting material similarly at the other openings, e.g. over anode 351 and subsequent anodes. Relative motion is also useful in smoothing out irregularities in the vapor plume, thus providing more uniform material deposition. While relative motion 530 is shown in one direction (that is, movement of the substrate and mask toward the right), it will be understood that motion in the reverse direction is equally effective.

When light emission is viewed through the anode and substrate, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, are used as the anode. For applications where EL emission is viewed only through the cathode electrode, the transmissive characteristics of the anode are immaterial and any conductive material can be used, regardless if it is transparent, opaque, or reflective. Example conductors for the present invention include, but are not limited to, gold, silver, iridium, molybdenum, palladium, and platinum. Typical anode materials, transmissive or otherwise, have a work function no less than 4.0 eV. Desired anode materials can be deposited by any suitable process such as evaporation, sputtering, chemical vapor deposition, or electrochemical deposition.

If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. If the device is bottom-emitting, that is, where EL emission is viewed only through the anode electrode, the transmissive characteristics of the cathode are immaterial and any conductive material can be used. Example conductors for the present invention include, but are not limited to, gold, silver, iridium, molybdenum, palladium, and platinum.

Sources 420 and 520 provide highly directional plumes of vaporized material, but require high temperatures to do so. This requires high energy costs, and can cause degradation of some materials, in particular organic materials. Many commercially available sources use lower temperatures and provide broader plumes of vaporized material. Turning now to FIG. 6*a*, there is shown a cross-sectional view of the mask and substrate of FIG. 4*a* in relation to another embodiment of a source for depositing vaporized organic materials upon the substrate in a vacuum chamber (not shown). The substrate and mask are the same as in FIG. 5a. Organic material vapor source 470 is a source of vaporized organic material 445. Vaporized organic material 445 can be the same material as vaporized organic material 440 of FIG. 5a, but organic material vapor source 470 emits the vaporized organic material in a plume comprising a much broader intrinsic cutoff angle θ'. Source 470 therefore has been selected to have a broader intrinsic plume shape and intrinsic cutoff angle relative to source 420 above. For the purposes of this disclosure, a source that provides a broader plume, and in particular one with an intrinsic cutoff angle greater than 60°, will be referred to as a broad source. It is desirable for the purposes of this invention that source 470 belong to a class of vaporizing devices that can vaporize both organic and non-organic (e.g. metal) materials, and can deposit layers of these materials such that previously deposited layers are not damaged. Such a class includes vacuum thermal evaporation devices. Such vapor sources include those described as rechargeable baffled box sources which are supplied commercially by e.g. RD Mathis Company and Kurt J Lesker Company and are well-known in the art.

The orientation of organic material vapor source 470 is selected in this embodiment to be parallel to perspective 180, that is, approximately perpendicular to the surface of substrate 300. In this orientation, vaporized organic material 445 can be deposited through exposed areas of mask 310. It is desired that vaporized organic material be deposited over the anode, e.g. anode 350, while leaving cathode lead 340, or a portion thereof, free for subsequent cathode contact. However, the wider distribution of organic material 445 in this embodiment means that some vaporized organic material 445 can be directed under the overhang feature, e.g. overhang feature 360, and can be deposited over cathode contact 340. One or more shields 480 separate from source 470 are placed in the vacuum chamber between organic material vapor source 470 and substrate 300 on one side of vaporized organic material 445. Shield 480 is located on the side of overhang feature 360 to interrupt the flow of vaporized organic material 445 emitted at greater than a selected cutoff angle θ, relative to normal to the surface of substrate 300, and thus shapes the vapor plume on the side corresponding to overhang feature 360. This limits substantial transfer of organic material on that side to angles less than or equal to a selected cutoff angle θ. The selected cutoff angle can be between 30° and 60°, and suitably between 40° and 50°, relative to normal to substrate 300. In the embodiment of FIG. 6a, the selected cutoff angle shown is approximately 45°. Those skilled in the art will understand that the exact selected cutoff angle, and thus placement of shield 480, will be determined by the relative locations and dimensions of anode 350, cathode lead 340, and overhang feature 360. This allows organic material 450 to be deposited on the open area of anode 350, with only limited deposition onto partially masked portions of the substrate, e.g. that provided by overhang feature 360.

As in FIG. 5a, vaporized organic material can be deposited substantially uniformly through the mask openings by making the distance between organic material vapor source 470 and substrate 300 great enough, or by providing relative motion 430 between organic material vapor source 470 and substrate 300 with mask 310, or both. Relative motion 430 is shown as moving the substrate to the right relative to the source; however relative motion in the reverse direction is equally effective. The relative positions of shield 480 and the organic material vapor source 470 are not changed during the deposition process.

Figure 6B:
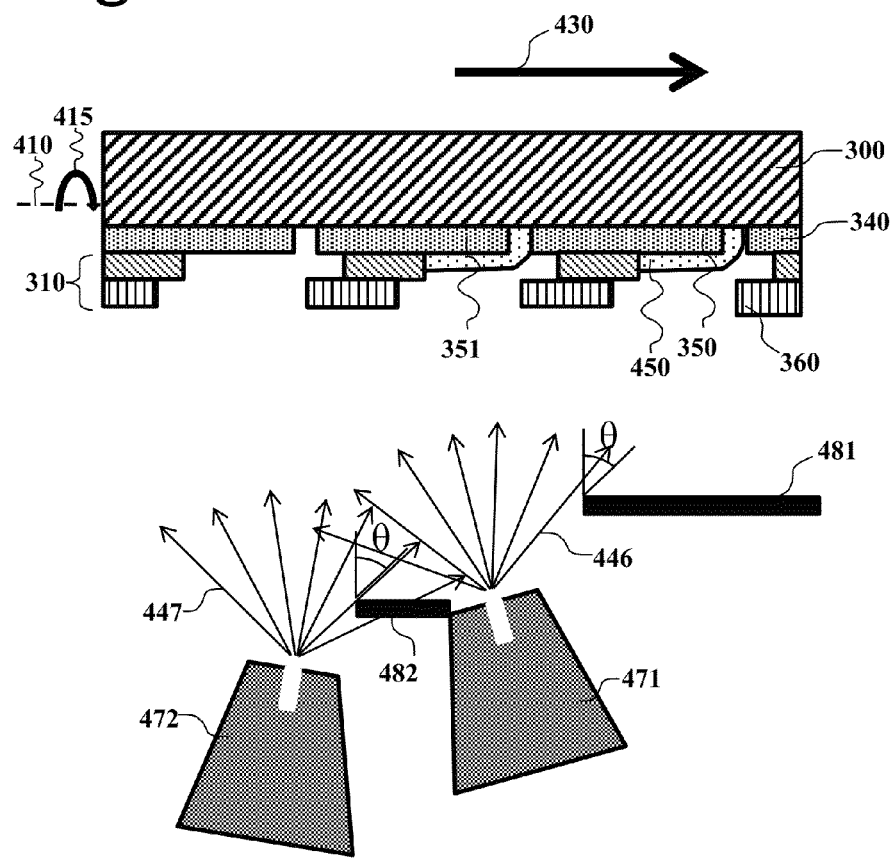
FIG. 6b shows a cross-sectional view of the mask and substrate of FIG. 4a in relation to another embodiment of a plurality of sources for depositing vaporized organic materials upon the substrate.

Turning now to FIG. 6b, there is shown a cross-sectional view of the mask and substrate of FIG. 4a in relation to another embodiment of a source for depositing vaporized organic materials upon the substrate in a vacuum chamber (not shown). The substrate and mask are the same as in FIG. 6a. A plurality of organic material vapor sources 471 and 472 provide vaporized organic material 446 and 447, respectively, for the formation of a multi-component layer. The sources are shown tipped slightly towards each other to provide intersection of the main part of each vapor plume so that the material deposited by this part of the plume has the desired composition. This is common in the art. Also shown are shields 481 and 482 as required to interrupt the flow of vaporized organic material 446 and 447 from each source that is emitted at greater than a selected cutoff angle θ, relative to normal to the surface of substrate 300 on the side of the overhang feature 360.

Figure 6C:
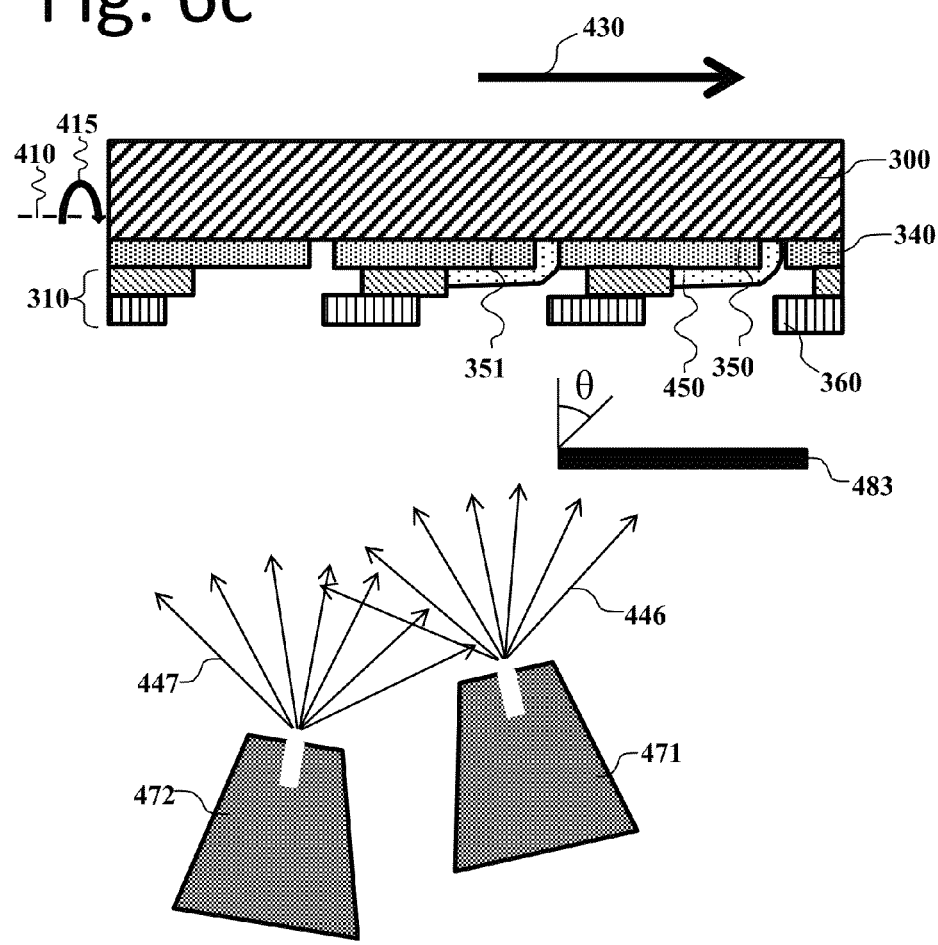
FIG. 6c shows a cross-sectional view of the mask and substrate of FIG. 4a in relation to another embodiment of a plurality of sources for depositing vaporized organic materials upon the substrate.

Turning now to FIG. 6c, there is shown a cross-sectional view of the mask and substrate of FIG. 4a in relation to another embodiment of a source for depositing vaporized organic materials upon the substrate in a vacuum chamber (not shown). The embodiment of FIG. 6c, comprising a plurality of organic material vapor sources 471 and 472, is similar to that of FIG. 6b, except that a common shield 483 interrupts the flow of vaporized organic materials 446 and 447 that is emitted at greater than a selected cutoff angle θ, relative to normal to the surface of substrate 300 on the side of the overhang feature 360.

Figure 6D:
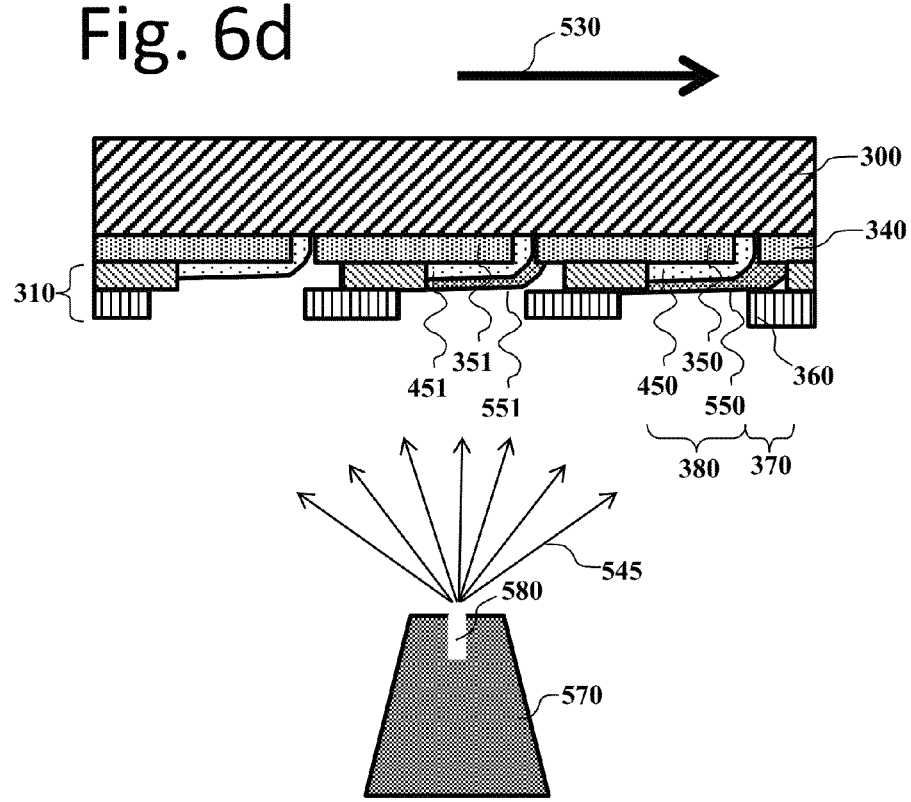
FIG. 6d shows a cross-sectional view of the mask and substrate of FIG. 4a in relation to another embodiment of a source for depositing vaporized cathode material upon organic material already deposited upon the substrate.

Turning now to FIG. 6d, there is shown a cross-sectional view of the mask and substrate of FIG. 4a in relation to another embodiment of a source for depositing vaporized conducting material upon organic material already deposited upon the substrate. Such apparatus is in a vacuum chamber (not shown), which can be the same vacuum chamber as in FIG. 6a, or a different chamber. One or more layers of organic material, e.g. organic material 450, sufficient to form the organic layers of an OLED device, have been deposited onto substrate 300 through mask openings 380 via the apparatus of FIG. 6a. Conducting material vapor source 570 is a source of conducting material in the form of vaporized conducting material 545. Source 570 includes a reservoir of conducting material, which is heated to vaporize it such that it is emitted by one or more nozzles 580. Vaporized conducting material 545 is emitted from nozzle 580 in a manner wherein the vapor plume has a broad distribution of angles and an intrinsic plume shape similar to or substantially the same as that from source 470 above. Thus, source 570 has similar or substantially the same intrinsic cutoff angle as source 470 above. It is desirable for the purposes of this invention that source 520 belong to a class of vaporizing devices that can vaporize both organic and non-organic (e.g. metal) materials, and can deposit layers of these materials such that previously deposited layers are not damaged. Such a class includes vacuum thermal evaporation devices.

The orientation of conducting material vapor source 570, and in particular its nozzle(s) 580, is selected to be normal to substrate 300. In contrast to the deposition of vaporized organic material, no shield is present with conducting material vapor source 570 on the side of the plume of vaporized conducting material 545 corresponding to overhang feature 360. In this embodiment, vaporized conducting material 545 can be deposited through exposed areas of mask 310, e.g. through mask opening 380, including under overhang feature 360. Thus, vaporized conducting material 545 can be deposited onto a second region including unmasked and partially masked portions of substrate 300. This is shown by conducting material 550, which is deposited on an unmasked portion (mask opening 380) and a partially masked portion 370, and therefore partially or completely covers the layers of organic material 450 and further extends beyond one side of the organic layers. As a result, conducting material 550 is in contact with cathode lead 340. The magnitude to which conducting material 550 extends beyond organic material 450 can be limited by the extent of overhang feature 360, e.g. distance 175 of FIG. 1a, or by the taper in the thickness of the conducting material down to a thickness not useful for conducting current. The latter is determined by the interaction of the overhang feature geometry and the vapor plume shape. The use of these design variables to achieve the good electrical contact between the conducting layer and the cathode lead will be apparent later. Vaporized conducting material 545 will not be deposited onto masked portions of the substrate, e.g. where mask 310 is in substantial contact with substrate 300 or its substituent features such as anodes. A circuit is thus formed by cathode lead 340, conducting material 550, organic material 450 (sufficient to form the organic layers of an OLED device), and anode 350. This thus creates a complete OLED device, above anode 350, through the use of a single mask for deposition both organic material layers in a first region and conducting material layers in a second region. Relative motion 530 between conducting material vapor source 570 and substrate 300 with mask 310, as disclosed above, can sequentially deposit conducting material similarly at the other openings, e.g. over anode 351 and subsequent anodes. For example, conducting material 551 is shown in an in-progress state of deposition.

Figure 7A:
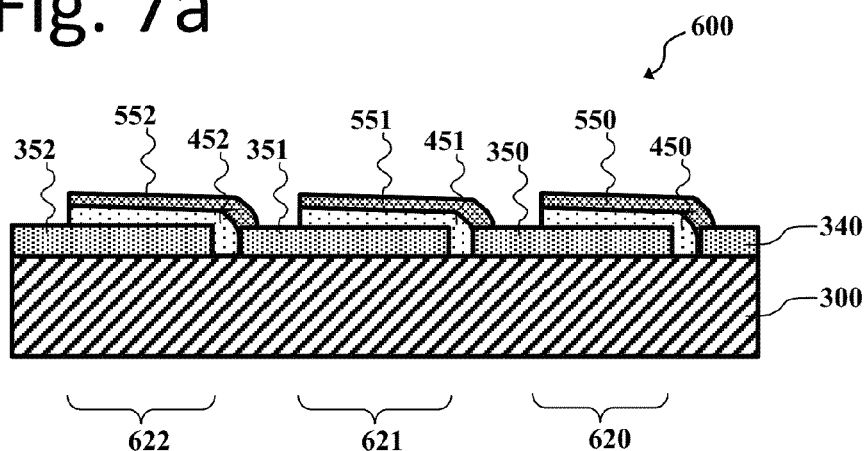
FIG. 7a shows a cross-sectional view of one embodiment of an organic light-emitting device prepared via the apparatus of this invention.

Turning now to FIG. 7a, there is shown a cross-sectional view of one embodiment of the organic light-emitting device prepared via the apparatus of this invention. Organic light-emitting device 600 includes the substrate 300 with cathode lead 340 and anodes 350, 351, and 352 as originally shown in FIG. 4a. Organic material 450, 451, and 452 has been deposited over anodes 350, 351, and 352, respectively, via the apparatus of FIG. 5a or 6a. As is well-known in the art, organic material 450, 451, and 452 can represent a plurality of layers deposited by multiple treatments via the apparatus of FIG. 5a or 6a, e.g. light-emitting layers, hole-transporting layers, electron-transporting layers, etc. The organic material can comprise single-stack devices or tandem devices, and can emit a single color or a broadband spectrum of light. Conducting material 550, 551, and 552 has been deposited over organic material 450, 451, and 452 and an additional portion, respectively, by the apparatus of FIG. 5b. Conducting material 550, 551, and 552 each form cathodes over their respective organic material. The respective cathodes, organic layers, and anodes form light-emitting units 620, 621, and 622 connected in series, and cathode lead 340 and anode 352 can be connected to outside current sources with sufficient voltage the drive the plurality of light-emitting sources. For example, current supplied by cathode lead 340 to conducting material 550 crosses organic material 450 to anode 350, causing light-emitting unit 620 to emit light. The current from anode 350 is delivered in series to conducting material 551, and crosses organic material 451 to anode 351, causing light-emitting unit 621 to emit light. Similarly, the current delivered in series to conducting material 552 will cause light-emitting unit 622 to emit light.

In the embodiment of FIG. 7a, multiple emission areas are connected in series horizontally along the substrate, which can have certain advantages. In such a configuration, the current flowing through the lighting panel is less than the current flowing through a similarly sized single-emission-area OLED lighting panel. Reduced current has advantages such as reduced power losses in the non-emitting conductive traces, the size of power contacts can be significantly reduced, and also the elimination of expensive additional patterned bus metal layers on the substrate. In addition, the size of each individual emission area is reduced compared to the total emitting area of the panel, reducing the voltage drop in the electrodes that can result in non-uniform light emissions. One further advantage of multiple smaller emission areas compared to one large emission area is that a shorting failure in one area does not cause the entire device to go dark. However, those skilled in the art will understand that, by varying the size and number of mask openings and the circuitry pattern upon the substrate, one can readily apply the apparatus and method of this invention to the formation of large single emission areas, or multiple emission areas connected in parallel.

Figure 7B:
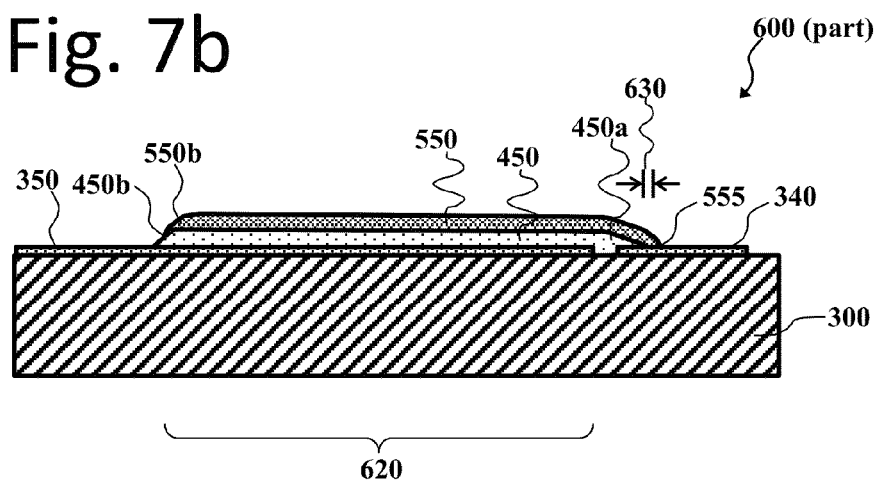
FIG. 7b shows a cross-sectional view of a portion of FIG. 7a in greater detail.

FIG. 7b shows a portion of organic light-emitting device 600 in greater detail and somewhat more dimensional accuracy, and serves to show some of the features of the OLED coatings which are important to the design of the masks of this invention. FIG. 7b shows light-emitting unit 620 of organic light-emitting device 600. For example, the edges of organic material 450, organic material edges 450a and 450b, do not have ideal sharply defined boundaries, but rather taper off from the full thickness near the center of the mask opening down to almost no thickness. For the OLED emissions to be substantially uniform in performance attributes such as brightness, color, lifetime, and color-shift with age and viewing angle, the light emitting area must be restricted by design to the region of the organic material 450 deposition that is substantially uniform in thickness. The emitting area will be defined by the overlapping combination of top and bottom electrodes with organic layers sandwiched between. Masks with designs like that shown in FIGS. 2a, 2b, and 2d will be useful for maximizing the emitting area. The horizontal extent of organic material edge 450a that forms under the overhang feature will be determined by the shape of the vaporized organic material plume, the location of a shield, as well as the properties of the mask itself. For example, increasing the thickness of lower mask 120 in FIG. 1a will increase the extent of the organic material penetration under overhang feature 140. Alternatively, use of a more directional organic material vapor source as shown in FIG. 5a or the use of one or more shields on one side of the vaporized organic material plume as shown in FIG. 6a will reduce the extent of this taper that forms under the overhang feature.

The horizontal extent to which conducting material 550 extends beyond organic material edge 450a toward cathode lead 340 will be dependent on the horizontal extent and geometry of the overhang feature, e.g. distances 125 and 175 in FIG. 1a, and the shape of the vaporized conducting material plume. Conducting material 550 is electrically connected to cathode lead 340 at contact 555. It will be understood that contact 555 comprises a linear strip orthogonal to the plane of FIG. 7b. The thickness of the layer of conducting material 550 and horizontal width 630 that conducting material 550 extends at contact 555 must be sufficient to allow the necessary current to flow from cathode lead 340 to conducting material 550 and through the conducting material to the emitting area without significant electrical energy losses. If the energy losses are significant, then the lighting device will not be efficacious and in extreme cases the heat generated in the contact region can result in failure of the electrical connection between cathode lead 340 and conducting material 550.

Non-limiting Example: For an OLED with a luminance efficiency of 50 cd/A run at a brightness of 3000 cd/m$^2$, a 2 cm wide lighted unit, e.g. light-emitting unit 620 of FIG. 7b, will have a current of 12 mA per linear cm at the contact edges, e.g. contact 555 in FIG. 7b. A contact design for a cathode in this invention may have a design guideline of 1 cm² of contact per Amp of current, depending on the thickness of the conductive electrode at the contact 555 and the quality of the contact made between the conductive material 550 and the corresponding conductive contact, e.g. cathode lead 340. At the operating current density, a voltage drop at the point of contact is desirably less than 1V, and usefully less than 0.1V. In this example the horizontal width 630 of the contact area between conducting material 550 and cathode lead 340 should be approximately 125 µm wide. Horizontal width 630 can be limited by either the extent the organic material is deposited under the overhang feature, or the depth of the overhang 170 (i.e. distance 175 in FIG. 1a). For vapor sources with broad distributions (e.g. FIG. 6a through 6d), limiting the vaporized organic material plume to an angle θ of 45° or less from normal on the side of the mask overhang feature with a lower mask thickness of 250 µm and overhang feature length (i.e. distance 175) of 500 µm results in the desired contact area and voltage loss within desired limits. One skilled in the art can see that numerous alternative combinations of organic and metal vapor plume distributions along with alternative mask thicknesses and shapes can be used to achieved desirable results.

When fabricating an OLED lighting device with multiple emitting areas, such as the device comprising serially connected elements shown in FIG. 7a, it is desirable to keep the non-emitting area between the emitting areas as small as possible to maximize the amount of light generated. To do so, the widths of partially masked portion 370 and masked portion 375 between adjacent units (FIG. 4a) should be minimized, e.g. by eliminating part or all of lower mask portion 325 between two emitting areas. Care must be taken to prevent shorting through electrical bridging between adjacent conductive layer areas. This requires control of conducting material plume shape on the side of the plume corresponding to the overhang feature to restrict the high angle component of vaporized conductive material. One can use a variety of techniques, e.g. varying the design and orientation of a source as in FIG. 5b, or providing a shield in the path of vaporized conducting material 545 in FIG. 6d.

In addition to the features of this invention, there can be other considerations in the design of such masks for manufacturing OLED lighting devices. Some of these arise from the fact that an OLED lighting device provides for large unified emitting areas (in comparison to the tiny individual pixels of an OLED display device). It is desirable to provide uniform light over the surface of such lighting devices. Referring to the left end of the emissive area in FIG. 7b, the organic material edge 450b thickness tapers from the uniform thickness of the emission area down to substantially zero in the area where the mask was in contact with the substrate. This is controlled by mask design features such as those shown in FIG. 1a. The conductive electrode at conducting material edge 550b must also taper in thickness from the full thickness in the emission area to zero at the edge. If conducting material edge 550b overlaps organic material edge 450b, a region of lower current resistance is created due to the thinner organic layer in that region. This can cause an uneven emission area, which is seen as a bright line or different color line along one or more edges of the OLED lighting device. It is therefore desirable that conducting material edge 550b be located inside of the boundary defined by organic material edge 450b, as shown in FIG. 7b. For example, the mask design of FIG. 1a reduces the unwanted shadowing of the plume due to the thickness of the mask, particularly with vapor plumes with broad directional distributions. Vapor emissions away from the normal angle can create shadows and hence form thinner layers in areas of partial shadow near the mask edge. The use of positively sloped edges, e.g. cutaway edge 135, reduces the horizontal width of organic material edge 450a in FIG. 7b and improves the usable emission area in the final device.

Other mask embodiments can have different but equally useful effects. For example, mask 111 of FIG. 1b has a vertical edge on the non-overhang edges of the mask openings. When this mask design embodiment used in combination with the nearly ideal sources of FIGS. 5a and 5b, the vaporized conducting material, which is deposited from perspective 190 of FIG. 1b, will be partially prevented from being deposited in partially masked portion 171. This can help keep the boundary of conducting material edge 550b inside organic material edge 450b of FIG. 7b, preventing a bright edge line in the lighting device, and can also be helpful in reducing the likelihood of shorting between the upper and lower electrodes. This use of mask design to control relative areas of deposition of the organic layers and the conductive layer can eliminate the need for an expensive insulating layer on top of the conductive lower electrode layer on the substrate in order to restrict emissions to the area of uniform and planar organic deposition. The mask embodiment of FIG. 1c can be useful in at least three instances. When using sources with broader vapor plume distributions, such as shown in FIG. 6a, this configuration of masks allows the taper in the thickness of the organic layer, e.g. organic material edge 450b of FIG. 7b, to be moved under the upper mask so that the conductive layer contacts the organic layers only in the areas where they are planar and of uniform thickness. A second application of the mask embodiment shown on the left side of FIG. 1c is when it is necessary or desirable to have cathode contacts on multiple sides of the display for the purpose of reducing the non-uniformity of illumination due to voltage drop in the cathode. This can be useful for very large emitting areas, or when the resistivity of the cathode is high, such as in top emission or dual emission lighting panels. A third application of this mask embodiment is when it is desired to have multiple conductive layers with independent connections in an OLED, such as in a stacked OLED where it is useful to independently control the light emissions from the individual stacks. This would be useful for allowing the user to change the color of the light, without requiring the use of separate organic vapor deposition masks or color filters to regions with different colored emissions.

In the mask of FIG. 4b, it can be an advantage to design the size of the electrode pattern on the substrate to be slightly smaller than mask opening 380 along the top and bottom of the opening. This would allow the thinner organic material edge along these sides to fall outside the electrode area, which would eliminate the possibility of bright lines along these edges. Alternatively, masks with positively sloped sides along the top and bottom edges will allow larger areas for emissions on these sides.

Figure 8A:
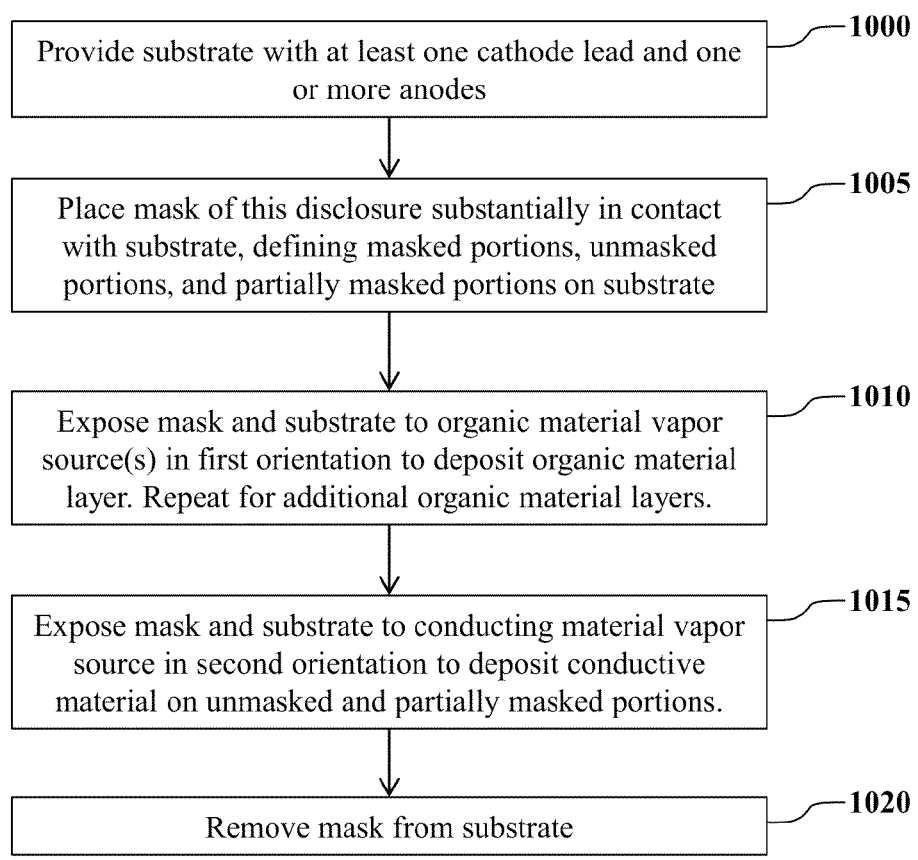
FIG. 8a is a schematic view of one embodiment of the method of this invention.

Turning now to FIG. 8a, there is shown a schematic view of one embodiment of the method of this invention for preparing an OLED lighting device, wherein one or more organic layers are deposited on one or more first regions of a substrate, and a conductive layer such as a cathode is deposited on one or more second regions of the substrate, utilizing the same removable mask. FIG. 8a can be understood in light of various foregoing apparatus embodiments of this disclosure, and reference will be made to features of the foregoing embodiments. In step 1000, a substrate suitable for use in an OLED lighting device, e.g. substrate 300, is provided. Substrate 300 is patterned on one surface with conductive areas, e.g. cathode lead 340 and anodes 350, 351, and 352, with insulating areas between them.

In step 1005, a reusable mask 310 is placed substantially in contact with the substrate. The mask has one or more mask openings 380 that expose selected portions of the substrate. One of the mask opening edges is structured to have an overhang feature 360 that masks a portion of the substrate surface at selected perspectives. Thus, the mask defines on substrate 300 one or more unmasked portions (e.g. mask opening 380), one or more partially masked portions 370, and one or more masked portions (e.g. portions where first mask 320 is in substantial contact with substrate 300).

In step 1010, the mask and substrate are exposed under vacuum to a plume of vaporized organic material from one or more sources of organic material vapor, e.g. organic material vapor source 420 of FIG. 5a, wherein the source is a narrow source that intrinsically provides a shaped largely unidirectional plume of material and is in a first orientation relative to the substrate and mask. In this first orientation, the unmasked portions of the substrate are exposed to the vaporized organic material. Organic material is deposited at a first region comprising the unmasked portions of the substrate, with no or only limited deposition in the partially masked portions, to deposit an organic material layer on a selected first region of the substrate, as disclosed in one embodiment in FIG. 5a. Step 1010 can be repeated with different organic materials, using the same or a different source, to deposit multiple organic layers over the same selected first region of the substrate.

In step 1015, the mask and substrate, with the deposited organic material, are exposed under vacuum to a plume of vaporized conducting material from one or more sources of conductive material vapor, e.g. conducting material vapor source 520 of FIG. 5b, wherein the source is a narrow source that intrinsically provides a largely unidirectional plume of material and is in a second orientation relative to the substrate and the mask. It is important to note that the mask and substrate can be moved as a unit from one vacuum chamber in step 1010 to a different chamber in step 1015, but that the mask and substrate are held in the same relative position to each other so that the positions of the mask and substrate relative to each other do not change. In this second orientation, the unmasked and partially masked portions of the substrate are exposed to the vaporized conducting material, while the masked portions are not so exposed, as disclosed in one embodiment in FIG. 5b. Conducting material is deposited at the unmasked and partially masked portions of the substrate, to deposit a conducting material layer on a selected second region of the substrate that partially or completely overlaps the selected first region on which the organic material had been deposited, and further extends beyond the first region on the side of the first region corresponding to the overhang feature of the mask. Thus, deposition of organic material over a first region and conducting material over a second region is accomplished with a single mask whose location relative to the substrate is not changed during the two depositions.

In step 1020, the mask is removed from the substrate. The organic material layer deposited over a first region is shown in FIG. 7a by e.g. organic material 450 deposited over a portion of anode 350 and the neighboring gap. Conducting material 550 is deposited over a second region that includes the first region defined by organic material 450 and extends further over cathode lead 340. Similarly, conducting materials 551 and 552 cover the regions of their respective organic materials and extend further over a portion of neighboring anode 350 and 351, respectively, thus forming a series circuit of a plurality of light-emitting units, and thus allowing the formation of organic layers and conducting layers over different regions of a substrate by utilizing the same mask.

Figure 8B:
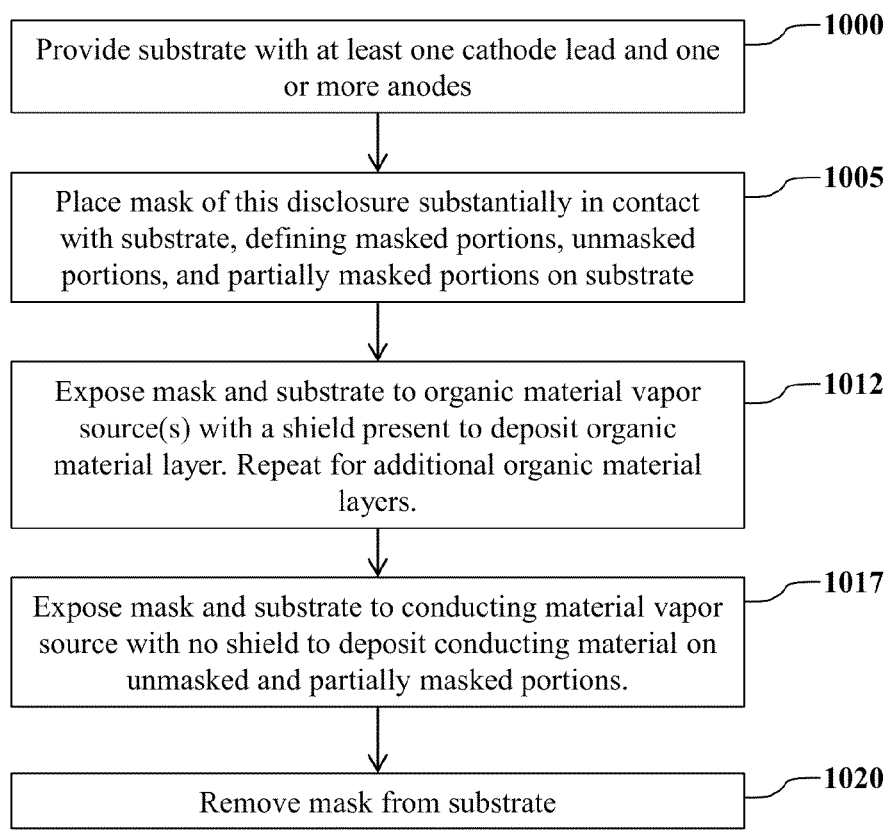
FIG. 8b is a schematic view of another embodiment of the method of this invention.

Turning now to FIG. 8b, there is shown a schematic view of another embodiment of the method of this invention, wherein one or more organic layers are deposited on one or more first regions of a substrate, and a conductive layer such as a cathode is deposited on one or more second regions of the substrate, utilizing the same removable mask. In step 1000, a substrate suitable for use in an OLED lighting device, e.g. substrate 300, is provided. Substrate 300 is patterned on one surface with conductive areas, e.g. cathode lead 340 and anodes 350, 351, and 352, with insulating areas between them. In step 1005, a reusable mask 310 is placed substantially in contact with the substrate. The mask has one or more mask openings 380 that expose selected portions of the substrate and one of the mask opening edges is structured to have an overhang feature. Steps 1000 and 1005 are the same as in FIG. 8a.

In step 1012, the mask and substrate are exposed under vacuum to a plume of vaporized organic material from one or more sources of organic material vapor, e.g. organic material vapor source 470 of FIG. 6a, wherein the source is a broad source that intrinsically emits the vaporized organic material in a plume comprising a broad angle, and a shield separate from the source is located between the organic material vapor source and the substrate. The unmasked portions of the substrate are exposed to the vaporized organic material, while the shield shapes the plume to limit substantial transfer of organic material to angles less than or equal to a selected cutoff angle on the side corresponding to the overhang feature of the mask, minimizing deposition of the organic material in the partially masked portions, as disclosed in various embodiments herein, e.g. FIG. 6a. Step 1012 can be repeated with different organic materials, using the same or a different source, to deposit multiple organic layers over the same selected first region(s) of the substrate.

In step 1017, the mask and substrate, with the deposited organic material, are further exposed under vacuum to a plume of vaporized conducting material from one or more sources of conducting material vapor, e.g. conducting material vapor source 570 of FIG. 6d, wherein the source is a broad source that intrinsically emits the vaporized conducting material in a plume comprising a broad angle. No shield is present between the source and substrate. It is important to note that the mask and substrate can be moved as a unit from one vacuum chamber in step 1012 to a different chamber in step 1017, but that the mask and substrate are held in the same relative position to each other so that the positions of the mask and substrate relative to each other do not change. The unmasked and partially masked portions of the substrate are exposed to the vaporized conducting material, while the masked portions are not so exposed, as disclosed in one embodiment in FIG. 6d. Thus, conducting material is deposited on a selected second region of the substrate that partially or completely overlaps the selected first region on which the organic material had been deposited, and further extends beyond the first region on the side of the first region corresponding to the overhang feature of the mask. Thus, deposition of organic material over a first region and conducting material over a second region is accomplished with a single mask whose location relative to the substrate is not changed during the two depositions.

In step 1020, the mask is removed from the substrate. The organic material layer deposited over a first region is shown in FIG. 7a by e.g. organic material 450 deposited over a portion of anode 350 and the neighboring gap. Conducting material 550 is deposited over a second region that in the embodiment of FIG. 7a includes the first region defined by organic material 450 and extends further over cathode lead 340. Similarly, conducting materials 551 and 552 cover the regions of their respective organic materials and extend further over a portion of neighboring anode 350 and 351, respectively, thus forming a series circuit of a plurality of light-emitting units, and thus allowing the formation of organic layers and conducting layers over different regions of a substrate by utilizing the same mask.

While the principles of the disclosure have been illustrated in relation to the exemplary embodiments shown herein, the principles of the disclosure are not limited thereto and include any modification, variation, or permutation thereof.

What is claimed is:

1. An apparatus for depositing one or more organic material layers of an OLED lighting device upon a first region of a substrate and one or more conductive layers of the OLED lighting device upon a second region, wherein the one or more conductive layers partially or completely cover the one or more organic layers and further extend beyond one side of the one or more organic layers, the apparatus comprising:
   a) a reusable mask including one or more open areas and positioned and held in contact with but not bonded to the substrate, wherein one edge of at least one mask open area is structured to include an overhang feature so as to define a masked portion, an unmasked portion, and a partially masked portion of the substrate, and wherein the unmasked portion of the substrate includes at least a portion of a first electrode and the partially masked portion of the substrate includes at least a portion of a second electrode that is non-contiguous to the first electrode;
   b) one or more sources of vaporized organic material, wherein the one or more sources of vaporized organic material comprise a vacuum thermal evaporation device and provide a plume of vaporized organic material comprising a selected intrinsic plume shape with an intrinsic cutoff angle greater than 60° from a centerline of the plume of vaporized organic material, and wherein the intrinsic cutoff angle defines a region about the centerline that includes 90% of a total flux of vapor of the plume of vaporized organic material;
   c) one or more shields located between at least one of the one or more sources of vaporized organic material and at least a portion of the substrate and located on a side of the plume of vaporized organic material corresponding to the overhang feature of the reusable mask, wherein said one or more shields serve to shape the plume of vaporized organic material on the side of the plume of vaporized organic material corresponding to the overhang feature of the reusable mask, serve to limit transfer of at least some of the plume of vaporized organic material on said side of the plume of vaporized organic material to at least one angle less than or equal to a selected cutoff angle, and serve to allow, in combination with the overhang feature of the reusable mask, at least some of an unshielded portion of the plume of vaporized organic material to reach the first region of the substrate through said reusable mask, wherein said selected cutoff angle is relative to normal to a surface of the substrate and is less than the intrinsic cutoff angle, and wherein said first region comprises the unmasked portion of the substrate; and
   d) one or more sources of vaporized conductive material that transfer conductive material through said reusable mask to the second region, wherein said second region corresponds at least to the unmasked portion and the partially masked portion of the substrate, wherein the one or more sources of vaporized conductive material comprise a vacuum thermal evaporation device and provide a plume of vaporized conductive material comprising substantially the same intrinsic plume shape with substantially the same intrinsic cutoff angle of greater than 60° from a centerline of the plume of vaporized conductive material as that of the plume of vaporized organic material, and wherein the second region partially or completely overlaps the first region and further extends beyond the first region on a side of the first region corresponding to the overhang feature of the reusable mask.

2. The apparatus of claim 1 wherein the selected cutoff angle is between 30 and 60 degrees relative to normal to the surface of the substrate.

3. The apparatus of claim 1 wherein the selected cutoff angle is between 40 and 50 degrees relative to normal to the surface of the substrate.

4. The apparatus of claim 1 further including one or more devices configured to provide relative motion between (a) the one or more sources of vaporized organic material and the one or more sources of vaporized conductive material and (b) the substrate and mask.

5. The apparatus of claim 1 wherein the reusable mask comprises two or more individual masks, wherein one edge of at least one open area of each of the individual masks is offset to provide the overhang feature.

6. The apparatus of claim 5 wherein the reusable mask comprises a lower mask and an upper mask, wherein one edge of at least one open area of the upper and lower masks is offset to provide the overhang feature.

7. The apparatus of claim 1 wherein the reusable mask comprises a single mask, wherein one edge of at least one open area of the mask is structured to provide the overhang feature.

8. The apparatus of claim 1 wherein the overhang feature is above and separated from the substrate by a distance of 50 to 1000 micrometers.

9. The apparatus of claim 1 wherein the overhang feature is above and separated from the substrate by a distance of 100 to 300 micrometers.

10. A method for depositing one or more organic material layers of an OLED lighting device upon a first region of a substrate and one or more conductive layers of the OLED lighting device upon a second region, wherein the one or more conductive layers partially or completely cover the one or more organic layers and further extend beyond one side of the one or more organic layers, the method comprising the steps of:
   providing a substrate suitable for use in the OLED lighting device;
   placing a reusable mask in contact with the substrate and holding the reusable mask in position, the reusable mask including one or more mask open areas, wherein one edge of at least one mask open area includes an overhang feature so as to define a masked portion, an unmasked portion, and a partially masked portion of the substrate, and wherein the unmasked portion of the substrate includes at least a portion of a first electrode and the partially masked portion of the substrate includes at least a portion of a second electrode that is non-contiguous to the first electrode;
   exposing, by way of one or more sources comprising a vacuum thermal evaporation device, the reusable mask and the substrate to a plume of vaporized organic material comprising an intrinsic plume shape with an intrinsic cutoff angle greater than 60° from a centerline of the plume of vaporized organic material;

shaping the plume of vaporized organic material to limit transfer of at least some of the plume of vaporized organic material to at least one angle less than or equal to a selected cutoff angle on a side of the plume of vaporized organic material corresponding to the overhang feature of the reusable mask, wherein the selected cutoff angle is less than the intrinsic cutoff angle, the exposing and the shaping allowing at least some of an un-shaped portion of the plume of vaporized organic material to be deposited upon the first region of the substrate through said reusable mask, the first region comprising the unmasked portion of the substrate;

further exposing, by way of one or more sources comprising a vacuum thermal evaporation device, the reusable mask and the substrate to a plume of vaporized conductive material comprising substantially the same intrinsic plume shape with substantially the same intrinsic cutoff angle of greater than 60° from a centerline of the plume of vaporized conductive material as that of the plume of vaporized organic material, and thereby depositing conductive material upon the second region through said reusable mask, the second region corresponding at least to the unmasked portion and the partially masked portion of the substrate, wherein the second region partially or completely overlaps the first region and further extends beyond the first region on a side of the first region corresponding to the overhang feature of the reusable mask; and removing the reusable mask from the substrate.

11. The method of claim 10, wherein a plurality of organic layers are deposited by sequentially exposing the mask and substrate to different organic materials.

12. The method of claim 10, wherein the conductive material forms an electrical connection to a contact located in the second region and beyond the first region.

13. An OLED lighting device prepared by the method of claim 10.

14. The OLED lighting device of claim 13 wherein the device includes serially connected elements.

15. The method of claim 10, wherein the plume of vaporized organic material and the plume of vaporized conductive material comprise a broad angle of distribution.

16. The method of claim 10, wherein the plume of vaporized organic material and the plume of vaporized conductive material comprise a narrow angle of distribution.

* * * * *